(12) United States Patent
Kobayashi et al.

(10) Patent No.: US 11,838,665 B2
(45) Date of Patent: Dec. 5, 2023

(54) COMPARATOR, AD CONVERTER, PHOTOELECTRIC CONVERSION DEVICE, IMAGING SYSTEM, AND MOVABLE OBJECT

(71) Applicant: CANON KABUSHIKI KAISHA, Tokyo (JP)

(72) Inventors: Hideo Kobayashi, Tokyo (JP); So Hasegawa, Kanagawa (JP)

(73) Assignee: CANON KABUSHIKI KAISHA, Tokyo (JP)

(*) Notice: Subject to any disclaimer, the term of this patent is extended or adjusted under 35 U.S.C. 154(b) by 107 days.

(21) Appl. No.: 17/176,395

(22) Filed: Feb. 16, 2021

(65) Prior Publication Data
US 2021/0266485 A1 Aug. 26, 2021

(30) Foreign Application Priority Data
Feb. 26, 2020 (JP) .................................. 2020-030600

(51) Int. Cl.
*H04N 25/75* (2023.01)
*H03K 5/24* (2006.01)
*H03M 1/06* (2006.01)

(52) U.S. Cl.
CPC ........... *H04N 25/75* (2023.01); *H03K 5/2481* (2013.01); *H03M 1/0607* (2013.01)

(58) Field of Classification Search
CPC .... H04N 5/378; H03K 5/2481; H03M 1/0607
See application file for complete search history.

(56) References Cited

U.S. PATENT DOCUMENTS

| 9,049,389 | B2 | 6/2015 | Hashimoto |
| 9,094,629 | B2 | 7/2015 | Ishibashi |
| 9,270,905 | B2 | 2/2016 | Ogura |
| 9,635,298 | B2 | 4/2017 | Nakamura |

(Continued)

FOREIGN PATENT DOCUMENTS

| CN | 102917182 A | 2/2013 |
| CN | 106454158 A | 2/2017 |

(Continued)

OTHER PUBLICATIONS

Japanese Office Action dated May 17, 2022, during prosecution of related Japanese application No. 2020-030600 (English-language translation included.).

(Continued)

*Primary Examiner* — Twyler L Haskins
*Assistant Examiner* — Fayez A Bhuiyan
(74) *Attorney, Agent, or Firm* — VENABLE LLP

(57) ABSTRACT

A disclosed comparator includes a comparison circuit that performs comparison between an input signal and a reference signal and changes a level of a signal to be output to a first node in accordance with a result of the comparison; and a positive feedback circuit including an amplifier unit that includes a current source load and outputs a signal in accordance with a potential of the first node to a second node and a feedback unit that positively feeds back a signal in accordance with a potential of the second node to the first node. The feedback unit includes a first transistor to which output of the amplifier unit is fed back and a switch that controls turning on or off of the first transistor.

30 Claims, 21 Drawing Sheets

(56) References Cited

U.S. PATENT DOCUMENTS

| | | | |
|---|---|---|---|
| 9,947,615 B2 | 4/2018 | Kobayashi | |
| 10,498,322 B1 * | 12/2019 | Ebihara | H03M 1/56 |
| 10,504,831 B2 | 12/2019 | Kobayashi | |
| 2009/0128676 A1 | 5/2009 | Tanaka | |
| 2014/0027617 A1 | 1/2014 | Amikawa | |
| 2018/0035062 A1 | 2/2018 | Tsukida | |
| 2019/0207596 A1 * | 7/2019 | Sakakibara | H03M 1/002 |

FOREIGN PATENT DOCUMENTS

| | | | |
|---|---|---|---|
| CN | 107665901 A | 2/2018 | |
| JP | S57-075022 A | 5/1982 | |
| JP | H05-249149 A | 9/1993 | |
| JP | H06-109779 A | 4/1994 | |
| JP | 2010-016656 A | 1/2010 | |
| JP | 2013-187815 A | 9/2013 | |
| JP | 2017-005443 A | 1/2017 | |
| JP | 2019-47383 A | 3/2019 | |
| WO | 2016-136448 A1 | 9/2016 | |
| WO | 2018/037901 A | 3/2018 | |

OTHER PUBLICATIONS

U.S. Appl. No. 17/166,346, filed Feb. 3, 2021 by Hideo Kobayashi.
Chinese Office Action dated Aug. 18, 2023 in corresponding Chinese Patent Application No. 202110201276.6 (English translation included).

* cited by examiner

COMPARATOR, AD CONVERTER, PHOTOELECTRIC CONVERSION DEVICE, IMAGING SYSTEM, AND MOVABLE OBJECT

BACKGROUND OF THE INVENTION

Field of the Invention

The present invention relates to a comparator, an AD converter, a photoelectric conversion device, an imaging system, and a movable object.

Description of the Related Art

An imaging device on which a column-parallel analog-to-digital (AD) converter including AD conversion units on a pixel column basis is mounted is proposed. A typical column-parallel AD converter performs AD conversion on a pixel signal by using a comparator to compare a pixel signal with a reference signal whose level changes with time and counting the time from start of the comparison to inversion of the output signal of the comparator. International Publication No. WO2018/037901 discloses an imaging device including a comparator including a positive feedback circuit used for increasing the transition rate when an output signal is inverted.

In the conventional comparator, however, fluctuations may occur in the power supply voltage or the reference voltage due to interference between positive feedback circuits arranged on different columns, and variation may occur in the timing of inversion of the output signal. Thus, when an AD conversion circuit is formed using such comparators, an AD conversion error due to a fluctuation of the power supply voltage or the reference voltage may occur.

SUMMARY OF THE INVENTION

The object of the present invention is to provide a comparator that may suppress influence due to a fluctuation of the power supply voltage or the reference voltage and an AD converter, a photoelectric conversion device, and an imaging system that use such a comparator.

According to one aspect of the present invention, provided is a comparator including a comparison circuit that performs comparison between an input signal and a reference signal and changes a level of a signal to be output to a first node in accordance with a result of the comparison, and a positive feedback circuit including an amplifier unit that includes a current source load and outputs a signal in accordance with a potential of the first node to a second node and a feedback unit that positively feeds back a signal in accordance with a potential of the second node to the first node, and the feedback unit includes a first transistor to which output of the amplifier unit is fed back and a switch that controls turning on or off of the first transistor.

Further, according to another aspect of the present invention, provided is an analog-to-digital converter including the comparator described above, and a counter circuit that outputs, as digital data of the input signal, a count value in accordance with a length of a period from start of comparison between the input signal and the reference signal to a change of a level of the output signal.

Further, according to yet another aspect of the present invention, provided is a photoelectric conversion device including a plurality of pixels arranged so as to form a plurality of rows and a plurality of columns and each including a photoelectric converter, a plurality of output lines each arranged on each of the plurality of columns and each connected to the pixels on a corresponding column, and a plurality of analog-to-digital converters described above each connected to each of the plurality of output lines and configured to perform analog-to-digital conversion on pixel signals output from the pixels on a corresponding column.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
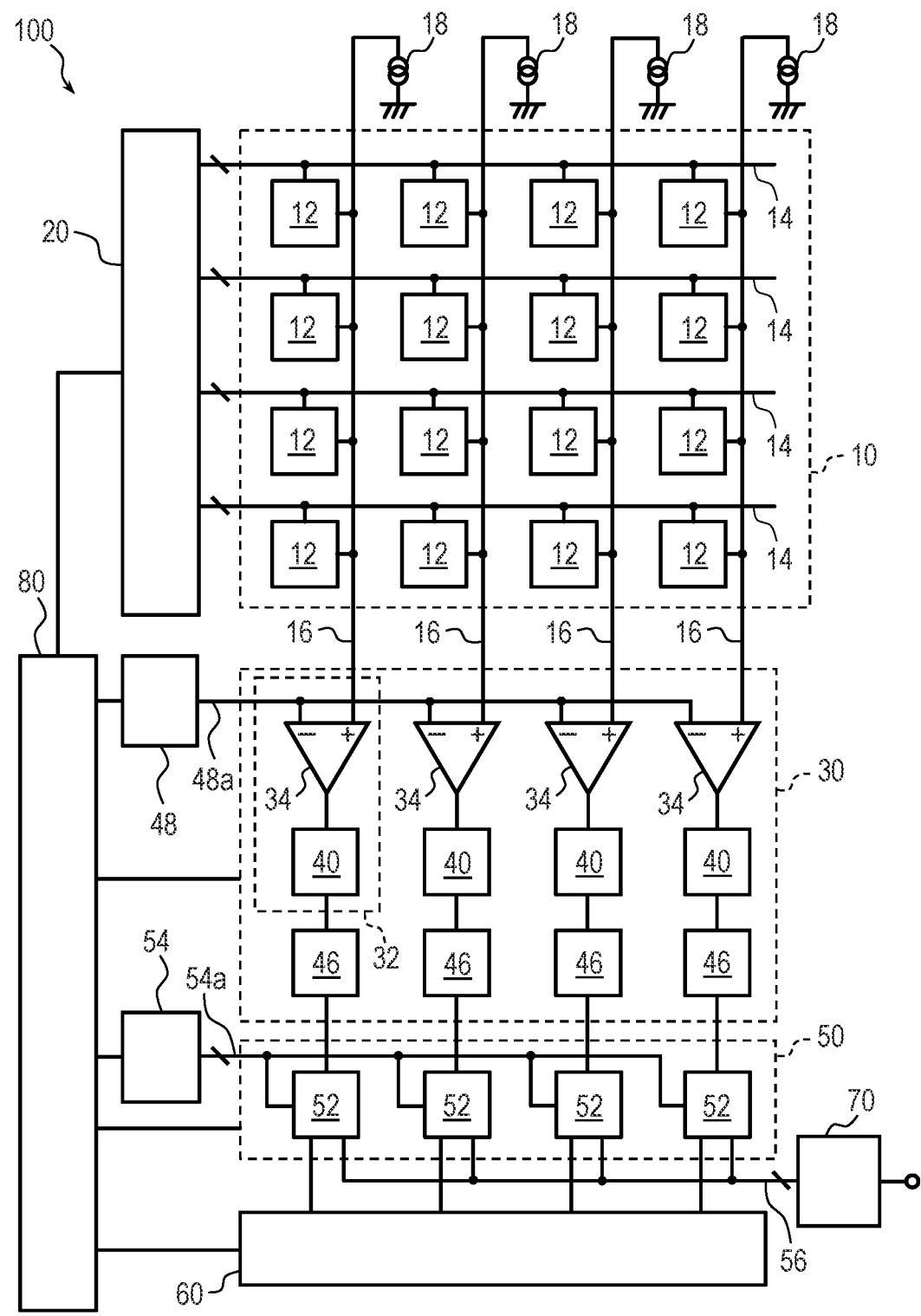
FIG. 1 is a block diagram illustrating a general configuration of a photoelectric conversion device according to a first embodiment of the present invention.

The general configuration of a photoelectric conversion device according to a first embodiment of the present invention will be described with reference to FIG. 1. FIG. 1 is a block diagram illustrating a general configuration of the photoelectric conversion device according to the present embodiment.

As illustrated in FIG. 1, a photoelectric conversion device 100 according to the present embodiment includes a pixel array unit 10, a vertical scanning circuit 20, an AD conversion circuit unit 30, a reference signal generation circuit 48, a memory unit 50, a counter circuit 54, a horizontal scanning circuit 60, an output circuit 70, and a control circuit 80.

In the pixel array unit 10, a plurality of pixels 12 arranged in a matrix over a plurality of rows and a plurality of columns are provided. Although FIG. 1 illustrates 16 pixels 12 arranged on four rows by four columns out of the pixels 12 forming the pixel array unit 10, the number of pixels 12 forming the pixel array unit 10 is not particularly limited.

On each row of the pixel array unit 10, a control line 14 is arranged extending in a first direction (horizontal direction in FIG. 1). Each of the control lines 14 is connected to the pixels 12 aligned in the first direction, respectively, to form a signal line common to these pixels 12. The first direction in which the control line 14 extends may be referred to as a row direction or the horizontal direction. The control lines 14 are connected to the vertical scanning circuit 20.

On each column of the pixel array unit 10, an output line 16 is arranged extending in a second direction (vertical direction in FIG. 1) crossing the first direction. Each of the output lines 16 is connected to the pixels 12 aligned in the second direction, respectively, to form a signal line common to these pixels 12. The second direction in which the output line 16 extends may be referred to as a column direction or the vertical direction. The output lines 16 are connected to the AD conversion circuit unit 30. A current source 18 used for supplying bias current to readout circuits in the pixels 12 is connected to the output line 16.

The vertical scanning circuit 20 is a control circuit unit that supplies control signals to the pixels 12 via the control line 14 provided on each row of the pixel array unit 10, and the control signals are used for driving readout circuits in the pixels 12 when reading out signals from the pixels 12. The vertical scanning circuit 20 may be formed using a shift register or an address decoder.

The AD conversion circuit unit 30 includes a plurality of comparators 32 and a plurality of pulse generators 46 in association with each column of the pixel array unit 10. Each of the plurality of comparators 32 includes a comparison circuit 34 and a positive feedback circuit 40. The comparison circuit 34 is formed of a differential pair circuit, for example, and has two input nodes (a non-inverting input terminal (+) and an inverting input terminal (−)) and one output node. The non-inverting input terminal of the comparison circuit 34 is connected to the output line 16 on a corresponding column. The inverting input terminal of the comparison circuit 34 is connected to a reference signal generation circuit 48 via a reference signal line 48a common to respective columns. The output node of the comparison circuit 34 is connected to the input node of the positive feedback circuit 40. The output node of the positive feedback circuit 40 is connected to the input node of the pulse generator 46. A known one-shot pulse generation circuit that outputs one shot of pulse upon detecting a rising edge or a falling edge of an input signal is applicable to the pulse generator 46. Note that the specific configuration and operation of the comparator 32 will be described later.

The reference signal generation circuit 48 supplies a reference signal having a predetermined amplitude to the comparator 32 on each column via the reference signal line 48a. The reference signal may be a signal whose signal level (magnitude of the signal) changes with time, for example. Typically, the reference signal is a ramp signal. The ramp signal is a signal whose signal level monotonically changes with time, which is a signal whose output voltage monotonically decreases or monotonically increases with time, for example. Note that the reference signal is not particularly limited as long as it has an amplitude that is applicable to AD conversion. The operation of the reference signal generation circuit 48 is controlled by the control circuit 80.

The memory unit 50 includes a plurality of memories 52 in association with each column of the pixel array unit 10. Each of the plurality of memories 52 may include an N-memory (not illustrated) that holds digital data for a noise signal and an S-memory (not illustrated) that holds digital data for a light detection signal. Each of the plurality of memories 52 has two input nodes, one output node, and one control node. One of the input nodes of the memory 52 is connected to the output node of the pulse generator 46 on a corresponding column. The other input node of the memory 52 is connected to the counter circuit 54 via a count signal line 54a common to respective columns. The output node of the memory 52 is connected to a horizontal output line 56. The control node of the memory 52 is connected to the horizontal scanning circuit 60.

The counter circuit 54 starts a count operation in synchronization with a timing of start of a change in a signal level of a reference signal output from the reference signal generation circuit 48 and outputs a count signal indicating the count value to the memory 52 on each column.

The horizontal scanning circuit 60 is a circuit unit that supplies control signals to the memories 52 on respective columns sequentially on a column basis, and the control signals are used for outputting pixel signals stored in the memories 52 on respective columns. Control lines of the horizontal scanning circuit 60 provided in association with respective columns of the pixel array unit 10 are connected to the memories 52 on corresponding columns. In response to receiving a control signal via the control line on a corresponding column of the horizontal scanning circuit 60, the memory 52 on each column outputs the held pixel signal to the output circuit 70 via the horizontal output line 56.

The output circuit 70 is a circuit unit that performs predetermined signal processing on a signal on a column selected by the horizontal scanning circuit 60 and outputs the signal to the external of the photoelectric conversion device 100. The output circuit 70 includes a signal processing unit formed of a buffer amplifier, a differential amplifier, or the like and performs signal processing such as an amplification process, a digital correlated double sampling (CDS) process, or the like. The digital CDS process is signal processing that performs a differential process of (S−N) when the memory 52 stores two types of digital data, namely, a noise signal N and a light detection signal S as a pixel signal. Further, the output circuit 70 further includes an external interface such as Low Voltage Differential Signaling (LVDS) and outputs a digital signal obtained after signal processing to the external of the photoelectric conversion device 100.

The control circuit 80 is a circuit unit used for supplying control signals to the vertical scanning circuit 20, the AD conversion circuit unit 30, the reference signal generation circuit 48, the memory unit 50, the counter circuit 54, and the horizontal scanning circuit 60, and the control signals are used for controlling the operations of the above components and the timings thereof. Some or all of the control signals supplied to vertical scanning circuit 20, the AD conversion circuit unit 30, the reference signal generation circuit 48, the memory unit 50, the counter circuit 54, and the horizontal scanning circuit 60 may be supplied from the external of the photoelectric conversion device 100.

Figure 2:
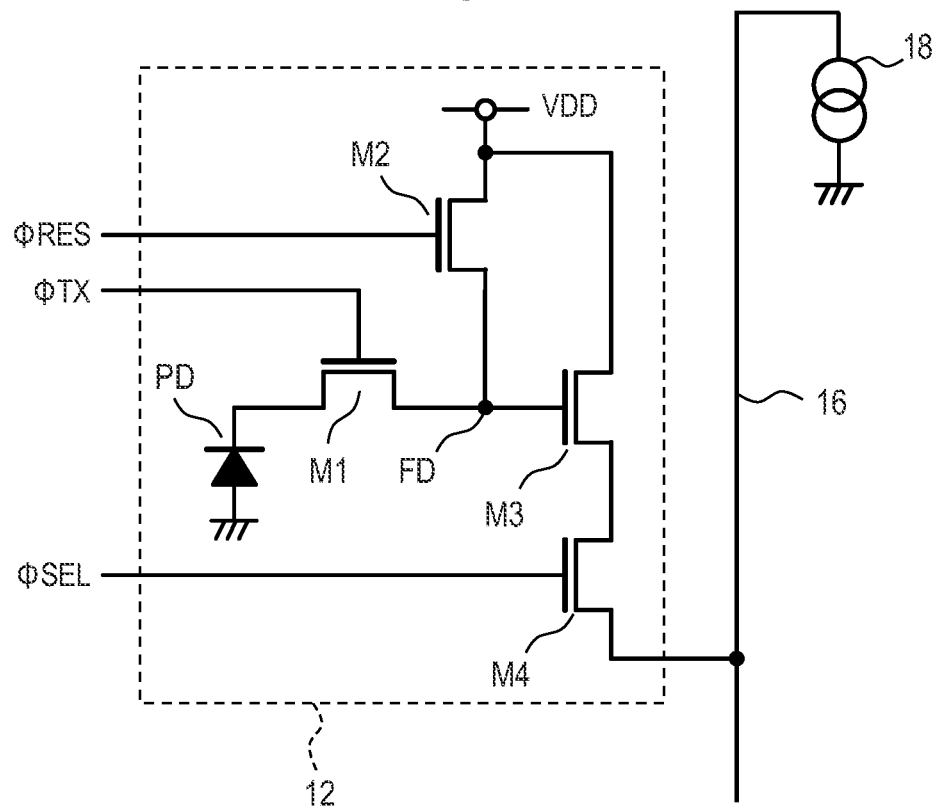
FIG. 2 is a circuit diagram illustrating a configuration example of a pixel in the photoelectric conversion device according to the first embodiment of the present invention.

Next, a configuration example of a pixel in the photoelectric conversion device according to the present embodiment will be described with reference to FIG. 2. FIG. 2 is a circuit diagram illustrating a configuration example of the pixel in the photoelectric conversion device according to the present embodiment.

Each of the pixels 12 may be formed of a photoelectric converter PD, a transfer transistor M1, a reset transistor M2, an amplifier transistor M3, and a select transistor M4, as illustrated in FIG. 2, for example.

The photoelectric converter PD is a photodiode, for example, the anode thereof is connected to a reference voltage node, and the cathode thereof is connected to the source of the transfer transistor M1. The drain of the transfer transistor M1 is connected to the source of the reset transistor M2 and the gate of the amplifier transistor M3. The connection node of the drain of the transfer transistor M1, the source of the reset transistor M2, and the gate of the amplifier transistor M3 is a so-called floating diffusion portion FD. The floating diffusion portion FD includes a capacitance component (floating diffusion capacitance) and has a function as a charge holding portion.

The drain of the reset transistor M2 and the drain of the amplifier transistor M3 are connected to the power supply voltage node to which a power supply voltage VDD is supplied. The source of the amplifier transistor M3 is connected to the drain of the select transistor M4. The source of the select transistor M4 is connected to the output line 16. The output line 16 is connected to the current source 18.

Note that the pixel 12 is not necessarily required to have the select transistor M4 and may have a pixel configuration not including the select transistor M4. In such a case, the source of the amplifier transistor M3 is connected to the output line 16.

In the case of the pixel configuration of FIG. 2, the control line 14 on each row arranged in the pixel array unit 10 includes signal lines TX, RES, and SEL. The signal line TX is connected to the gates of the transfer transistors M1 of the pixels 12 belonging to a corresponding row, respectively, to form a signal line common to these pixels 12. The signal line RES is connected to the gates of the reset transistors M2 of the pixels 12 belonging to a corresponding row, respectively, to form a signal line common to these pixels 12. The signal line SEL is connected to the gates of the select transistors M4 of the pixels 12 belonging to a corresponding row, respectively, to form a signal line common to these pixels 12.

A control signal ΦTX that is a drive pulse used for controlling the transfer transistor M1 is supplied to the signal line TX from the vertical scanning circuit 20. A control signal ΦRES that is a drive pulse used for controlling the reset transistor M2 is supplied to the signal line RES from the vertical scanning circuit 20. A control signal ΦSEL that is a drive pulse used for controlling the select transistor M4 is supplied to the signal line SEL from the vertical scanning circuit 20. When each transistor is formed of an n-channel transistor, a corresponding transistor is turned on in response to a control signal at a High level (hereafter, denoted as "H level") being supplied from the vertical scanning circuit 20. Further, a corresponding transistor is turned off in response to a control signal at a Low level (hereafter, denoted as "L level") being supplied from the vertical scanning circuit 20.

Next, the overview of the operation of the imaging device according to the present embodiment will be described with reference to FIG. 1 and FIG. 2.

Once light enters the pixel array unit 10, the photoelectric converter PD of each pixel 12 converts (photoelectrically converts) the incident light into an amount of charge in accordance with the light amount and accumulates the generated charge. When turned on, the transfer transistor M1 transfers charge held by the photoelectric converter PD to the floating diffusion portion FD. The floating diffusion portion FD holds charge transferred from the photoelectric converter PD and has a voltage in accordance with the amount of the charge transferred from the photoelectric converter PD due to charge-voltage conversion caused by the capacitance of the floating diffusion portion FD.

The amplifier transistor M3 is configured such that the power supply voltage VDD is supplied to the drain and bias current is supplied to the source from the current source 18 via the select transistor M4 and forms an amplifier unit (source follower circuit) whose gate is the input node. Accordingly, the amplifier transistor M3 outputs a signal based on the voltage of the floating diffusion portion FD to the output line 16 via the select transistor M4. In this sense, the amplifier transistor M3 also serves as an output unit that outputs a pixel signal based on charge held by the floating diffusion portion FD. When turned on, the reset transistor M2 resets the floating diffusion portion FD to a voltage in accordance with the power supply voltage VDD. Note that, in this specification, a signal output to the output line 16 when the floating diffusion portion FD is in a reset state is referred to as a noise signal, and a signal output to the output line 16 in a state where the floating diffusion portion FD holds signal charge is referred to as a light detection signal.

The transfer transistor M1, the reset transistor M2, and the select transistor M4 of the pixel 12 are controlled on a row basis by the control signals ΦTX, ΦRES, and ΦSEL supplied from the vertical scanning circuit 20, as described above. Pixel signals of the pixels 12 belonging to a row selected by the control signal ΦSEL are simultaneously output to the output line 16 which respective pixels 12 correspond to.

The comparator 32 on each column compares the level of a pixel signal read out from the pixel on a corresponding column via the output line 16 with the reference signal supplied from the reference signal generation circuit 48 and outputs a signal in accordance with a result of the comparison to the pulse generator 46. Specifically, the comparator 32 compares the magnitude of a pixel signal (signal SIG) with the magnitude of the reference signal (reference signal RAMP) and changes the level of the output signal at a timing when the level relationship between these signals is inverted. The pulse generator 46 outputs one shot of pulse in response to a change of the level of the output signal of the comparator 32.

The counter circuit 54 starts count from the start of comparison of a pixel signal with the reference signal and outputs a count signal indicating a count value to the memory 52 on each column via the count signal line 54a. The memory 52 on each column stores, as digital data of the pixel signal, a count value indicated by a count signal being output from the counter circuit 54 at a timing when a pulse is output from the pulse generator 46 on a corresponding column. This count value corresponds to the length of a period from the start of comparison of a pixel signal with the reference signal to a change of the level of the output signal. In such a way, it is possible to digitally convert an analog signal output from the pixel 12 into a digital signal.

The horizontal scanning circuit 60 supplies control signals to the memories 52 on respective column of the memory unit 50 sequentially on a column basis. The memory 52 on a column that receives a control signal from the horizontal scanning circuit 60 outputs a held pixel signal to the horizontal output line 56. The output circuit 70 performs predetermined signal processing on a pixel signal output from the memory unit 50 and outputs the pixel signal to the external of the photoelectric conversion device 100.

Figure 3:
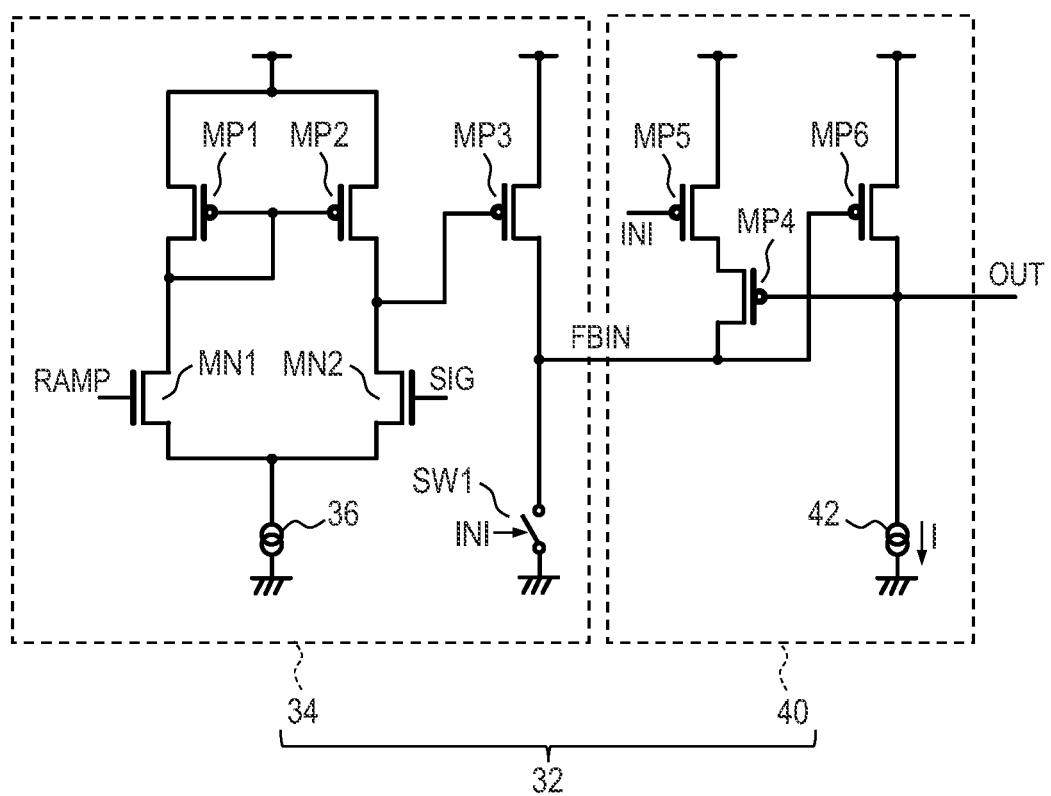
FIG. 3 is a circuit diagram illustrating a configuration example of a comparator in the photoelectric conversion device according to the first embodiment of the present invention.
Figure 4:
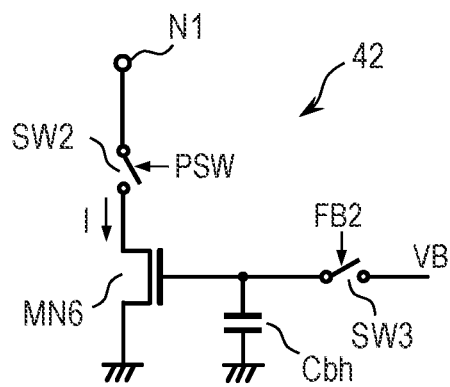
FIG. 4 is a circuit diagram illustrating a configuration example of a current source in the photoelectric conversion device according to the first embodiment of the present invention.

Next, the configuration example of the comparator 32 in the photoelectric conversion device according to the present embodiment will be described with reference to FIG. 3 and FIG. 4. FIG. 3 is a circuit diagram illustrating a configuration example of the comparator in the photoelectric conversion device according to the present embodiment. FIG. 4 is a circuit diagram illustrating a configuration example of the current source in the photoelectric conversion device according to the present embodiment.

The comparator 32 is formed including the comparison circuit 34 and the positive feedback circuit 40, as described above. Although the comparator 32 and the pulse generator 46 are described as separate components in the present embodiment, the pulse generator 46 may be configured as a part of the comparator 32.

The comparison circuit 34 may be formed of p-channel transistors MP1, MP2, and MP3, n-channel transistors MN1 and MN2, a tail current source 36, and a switch SW1, as illustrated in FIG. 3, for example. Out of these components, the p-channel transistors MP1 and MP2, the n-channel transistor MN1 and MN2, and the tail current source 36 form a differential unit, and the p-channel transistor MP3 forms an amplifier unit.

The source of the p-channel transistor MP1, the source of the p-channel transistor MP2, and the source of the p-channel transistor MP3 are connected to the power supply voltage node. The drain of the p-channel transistor MP1 is connected to the drain of the n-channel transistor MN1. The drain of the p-channel transistor MP2 is connected to the drain of the n-channel transistor MN2. The gate of the p-channel transistor MP1 and the gate of the p-channel transistor MP2 are connected to the connection node between the drain of the p-channel transistor MP1 and the drain of the n-channel transistor MN1. The tail current source 36 is connected between each source of the n-channel transistor MN1 and the n-channel transistor MN2 and the reference voltage node (for example, a ground node). The connection node between the drain of the p-channel transistor MP2 and the drain of the n-channel transistor MN2 is connected to the gate of the p-channel transistor MP3. That is, the connection node between the drain of the p-channel transistor MP2 and the drain of the n-channel transistor MN2 is the output node of the differential unit, and the gate of the p-channel transistor MP3 is the input node of the amplifier unit. The drain of the p-channel transistor MP3 is connected to the reference voltage node via the switch SW1.

Accordingly, the n-channel transistor MN1 and the n-channel transistor MN2 form a differential pair, and the p-channel transistor MP1 and the p-channel transistor MP2 form a current mirror. The gate of the n-channel transistor MN2 is the non-inverting input terminal of the comparison circuit 34 to which the signal SIG of the output line 16 is supplied. The gate of the n-channel transistor MN1 is the inverting input terminal of the comparison circuit 34 to which a reference signal RAMP is supplied from the reference signal line 48a. The connection node between the drain of the p-channel transistor MP3 and the switch SW1 is the output node (node FBIN) of the comparison circuit 34.

The switch SW1 is a switch whose connection state (conduction or non-conduction) is controlled in accordance with a control signal INI supplied from the control circuit 80. For example, the switch SW1 is turned on when the control signal INI is at the H level, and the switch SW1 is turned off when the control signal INI is at the L level. The switch SW1 is a reset switch that resets the potential of the node FBIN to the reference voltage. Note that the switch SW1 can also be considered as a part of the positive feedback circuit 40.

The positive feedback circuit 40 may be formed of p-channel transistors MP4, MP5, and MP6 and a current source 42, as illustrated in FIG. 3, for example. Out of these components, the p-channel transistor MP6 and the current source 42 form an amplifier unit, and the p-channel transistors MP4 and MP5 form a feedback unit.

The source of the p-channel transistor MP5 and the source of the p-channel transistor MP6 are connected to the power supply voltage node. The drain of the p-channel transistor MP5 is connected to the source of the p-channel transistor MP4. The drain of the p-channel transistor MP4 is connected to the gate of the p-channel transistor MP6. The current source 42 is connected between the drain of the p-channel transistor MP6 and the reference voltage node. The gate of the p-channel transistor MP4 is connected to the connection node between the drain of the p-channel transistor MP6 and the current source 42.

The connection node (node FBIN) between the drain of the p-channel transistor MP4 and the gate of the p-channel transistor MP6 is the input node of the positive feedback circuit 40. The input node of the positive feedback circuit 40 is connected to the connection node between the drain of the p-channel transistor MP3 and the switch SW1, that is, the output node of the comparison circuit 34. The connection node of the gate of the p-channel transistor MP4, the drain of the p-channel transistor MP6, and the current source 42 is the output node (node OUT) of the positive feedback circuit 40. The p-channel transistor MP5 is controlled by the control signal INI supplied from the control circuit 80.

The current source 42 forms a load element of the amplifier unit of the positive feedback circuit 40, which may typically form a gate grounded circuit and be formed of a transistor whose gate is supplied with a bias voltage that is different from the reference voltage. The current source 42 is not particularly limited and may be formed of an n-channel transistor MN6, a bias hold capacitor Cbh, and switches SW2 and SW3, as illustrated in FIG. 4, for example. The node N1 is one of the terminals of the current source 42, which is a node connected to the gate of the p-channel transistor MP4 and the drain of the p-channel transistor MP6 in the circuit of FIG. 3. In FIG. 4, the other terminal of the current source 42 is represented by the reference voltage node.

The switch SW2 is connected between the n-channel transistor MN6 and the node N1. The source of the n-channel transistor MN6 is connected to the reference voltage node. The gate of the n-channel transistor MN6 is connected to one of the electrodes of the bias hold capacitor Cbh. The other electrode of the bias hold capacitor Cbh is connected to the reference voltage node. Further, the gate of the n-channel transistor is supplied with the bias voltage VB via the switch SW3. The switch SW2 is a switch whose connection state (conduction or non-conduction) is controlled by a control signal PSW. Further, the switch SW3 is a switch whose connection state (conduction or non-conduction) is controlled by a control signal FB2. The switch SW2 is a switch used for power saving.

The bias voltage VB used for causing predetermined current I to flow in the n-channel transistor MN6 is supplied to the gate of the n-channel transistor MN6 via the switch SW3. By once turning on and then turning off the switch SW3, it is possible to hold the bias voltage VB in the bias hold capacitor Cbh. With such a configuration, even if the reference voltage GND fluctuates, it is possible to maintain the gate-source voltage Vgs of the n-channel transistor MN6 at a constant voltage and suppress the current I from fluctuating. Further, by turning off the switch SW2, it is possible to reduce power consumption when not used.

The circuit configuration illustrated in FIG. 4 is applicable not only to the current source 42 but also to the current source 18, the tail current source 36, and current sources 38 and 44 illustrated in the embodiment described later.

Note that the source and the drain of a transistor may be called opposite names in accordance with the conductivity type thereof, a function of interest, or the like. In this specification, the source and the drain may be denoted as a main node without distinction, and the gate may be denoted as a control node.

Figure 5:
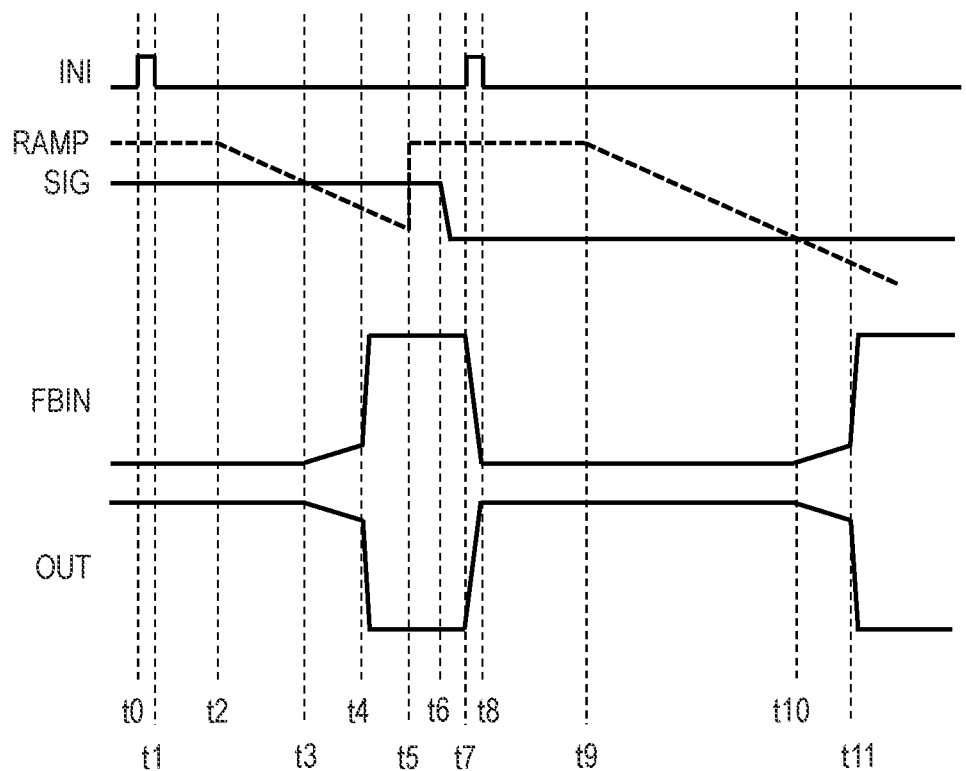
FIG. 5 is a timing diagram illustrating the operation of the comparator in the photoelectric conversion device according to the first embodiment of the present invention.

Next, the operation of the comparator 32 in the photoelectric conversion device according to the present embodiment will be described with reference to FIG. 5. FIG. 5 is a timing diagram illustrating the operation of the comparator in the photoelectric conversion device according to the present embodiment. FIG. 5 illustrates the control signal INI, the reference signal RAMP, the signal SIG of the output line 16, the potential of the node FBIN, and the potential of the node OUT.

At time t0, a signal (noise signal) in accordance with the reset level of the pixel 12 is being output as the signal SIG to the output line 16. Further, the reference level of the reference signal RAMP whose change in the potential level has not yet been started is higher than the level of the signal SIG in accordance with the reset level of the pixel 12. That is, in the present embodiment, the reference signal RAMP whose potential level gradually decreases with time is used.

First, in the period from time t0 to time t1, the control circuit 80 controls the control signal INI from the L level to the H level. Thereby, the p-channel transistor MP5 is turned off, the switch SW1 is turned on, and the potential of the node FBIN is reset to the reference voltage (GND). Further, in response to the potential of the node FBIN being at the reference voltage (GND), the p-channel transistor MP6 is turned on, and the potential of the node OUT, which is the output node of the positive feedback circuit, is at the H level close to the power supply voltage. Further, in response to the potential of the node OUT being the H level, the p-channel transistor MP4, which receives the potential of the node OUT at the gate, is turned off.

In the same period from time t0 to time t1, the level of the reference signal RAMP is in a state of being higher than the level of the signal SIG, the gate potential of the p-channel transistor MP3 is a level close to the power supply voltage, and the p-channel transistor MP3 is in an off-state.

At time t1, the control signal INI transitions from the H level to the L level, and thereby the switch SW1 is turned off. Accordingly, both the switch SW1 and the p-channel transistor MP3 are in the off-state, and the node FBIN is in a floating state at a level close to the reference voltage (GND).

At subsequent time t2, the reference signal generation circuit 48 starts changing the potential level of the reference signal RAMP. The reference signal generation circuit 48 outputs the reference signal RAMP having a ramp waveform whose potential gradually decreases with time, for example. Further, the counter circuit 54 starts count in synchronization with the start the change in the potential level of the reference signal RAMP and outputs a count signal indicating a count value to the count signal line 54a.

At subsequent time t3, it is assumed that the level of the reference signal RAMP decreases below the level of the signal SIG in accordance with the reset level of the pixel 12. In response, the gate potential of the p-channel transistor MP3 starts decreasing gradually from time t3, and thereby the potential of the node FBIN starts increasing gradually. Further, the gate potential of the p-channel transistor MP6 connected to the node FBIN starts increasing gradually, and thereby the potential of the node OUT starts decreasing gradually.

Accordingly, at subsequent time t4, the p-channel transistor MP4 is turned on. In response, the node FBIN and the power supply voltage node are connected to each other, thereby positive feedback is applied to the potential of the node FBIN, and the potential of the node FBIN increases rapidly. As a result, the potential of the node OUT decreases rapidly.

In response to the rapid change in the potential of the node OUT, the pulse generator 46 generates and outputs one shot of pulse to the memory 52. The memory 52 holds a count value, which is indicated by a count signal being output from the counter circuit 54 at the timing of receiving the pulse from the pulse generator 46, as digital data of the signal SIG in accordance with the reset level of the pixel 12, that is, digital data of a noise signal.

At subsequent time t5, the reference signal generation circuit 48 resets the potential level of the reference signal RAMP to the reference level.

At subsequent time t6, signal charge of the pixel 12 to be read out are transferred to the floating diffusion portion FD, thereby a signal (light detection signal) in accordance with the amount of signal charge as the signal SIG is output, and the level of the signal SIG of the output line 16 is reduced.

In the subsequent period from time t7 to time t8, the control circuit 80 controls the control signal INI from the L level to the H level. Thereby, the p-channel transistor MP5 is turned off, the switch SW1 is turned on, and the potential of the node FBIN is reset to the reference voltage (GND). Further, the potential of the node FBIN reaches the reference voltage (GND), thereby the p-channel transistor MP6 is turned on, and the potential of the node OUT, which is the output node of the positive feedback circuit, reaches the H level close to the power supply voltage. Further, in response to the potential of the node OUT reaching the H level, the p-channel transistor MP4 is turned off.

At subsequent time t9, the reference signal generation circuit 48 starts changing the potential level of the reference signal RAMP. Further, the counter circuit 54 newly starts count in synchronization with the start of the change in the potential level of the reference signal RAMP and outputs a count signal indicating a count value to the count signal line 54a.

At subsequent time t10, it is assumed that the level of the reference signal RAMP decreases below the level of the signal SIG in accordance with the amount of signal charge. In response, the gate potential of the p-channel transistor MP3 starts decreasing gradually from time t10, and thereby the potential of the node FBIN starts increasing gradually. Further, the gate potential of the p-channel transistor MP6 connected to the node FBIN starts increasing gradually, and thereby the potential of the node OUT starts decreasing gradually.

Accordingly, at subsequent time t11, the p-channel transistor MP4 is turned on. In response, the node FBIN and the power supply voltage node are connected to each other, thereby positive feedback is applied to the potential of the node FBIN, and the potential of the node FBIN increases rapidly. As a result, the potential of the node OUT decreases rapidly.

In response to the rapid change in the potential of the node OUT, the pulse generator 46 generates and outputs one shot of pulse to the memory 52. The memory 52 holds a count value, which is indicated by a count signal being output from the counter circuit 54 at the timing of receiving the pulse from the pulse generator 46, as digital data of the signal SIG in accordance with the amount of signal charge, that is, digital data of a light detection signal.

The digital data of the noise signal and the digital data of the light detection signal held in the memory 52 in such a way are transferred to the output circuit 70 in accordance with a control signal from the horizontal scanning circuit 60. In the output circuit 70, the difference between a digital value of the noise signal and a digital value of the light detection signal is calculated by using a so-called digital CDS process and output to the external of the photoelectric conversion device 100 as a final AD conversion result.

In the comparator 32 of the present embodiment, with the use of the amplifier using the current source 42 in the positive feedback circuit 40, it is possible to suppress interference between the positive feedback circuits 40 while achieving faster transition of the output of the comparison circuits 34 and the output of the positive feedback circuits 40. This feature will be described below.

The positive feedback circuit 40 can also be formed using a logic gate such as an inverter, for example, rather than using the amplifier using the current source 42 as with the present embodiment. However, when a positive feedback circuit is formed using a logic gate, through-current may flow from the power supply voltage node to the reference voltage node at transition of the input/output signal level. Such through-current typically has a full width at half maximum of around several nano seconds and a peak value of around several tens of micro amperes. Although FIG. 1 illustrates four comparison circuits 34 and four positive feedback circuits 40 as a column circuit for four columns, several hundreds to several thousands of column circuits are typically provided in the actual implementation, and significantly large through-current may occur in response to inversion operations of the positive feedback circuits 40.

At this time, since a finite impedance is attached to the power supply voltage node and the reference voltage node, large through-current may cause a large potential fluctuation to occur in the power supply voltage VDD or the reference voltage GND. Furthermore, as described above, the node FBIN, which is the output node of the comparison circuit 34 and also is the input node of the positive feedback circuit 40, is in a floating state on and after time t1 and may easily fluctuate due to the fluctuation of the power supply voltage VDD or the reference voltage GND. Accordingly, there will be a difference in the inversion timing in accordance with the number of positive feedback circuits 40 inverted at the same time, and a large error may occur in an AD conversion result. In other words, the error of AD conversion may be significantly increased because of the interference due to inversion operations of other positive feedback circuits 40.

In this regards, in the present embodiment, with the use of an amplifier using a current source load (current source 42) for the positive feedback circuit 40, the potential fluctuation of the power supply voltage VDD or the reference voltage GND is suppressed. Although a rise in the potential of the node FBIN at time t4 of FIG. 5 causes the p-channel transistor MP6 to transition to the off-state from the on-state where current of the current source 42 flows, the current value of the current source 42 is typically around several hundreds of nano amperes to several micro amperes. Therefore, compared to the case where a positive feedback circuit is formed using a logic gate, it is possible to reduce the peak value of current by around one to two digits. Therefore, according to the configuration of the comparator 32 of the present embodiment, it is possible to suppress interference between the positive feedback circuits 40 while achieving faster transition of the output of the comparison circuits 34 and the output of the positive feedback circuits 40.

As described above, according to the present embodiment, it is possible to suppress a fluctuation of the power supply voltage or the reference voltage in a comparator including a positive feedback circuit. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Second Embodiment

Figure 6:
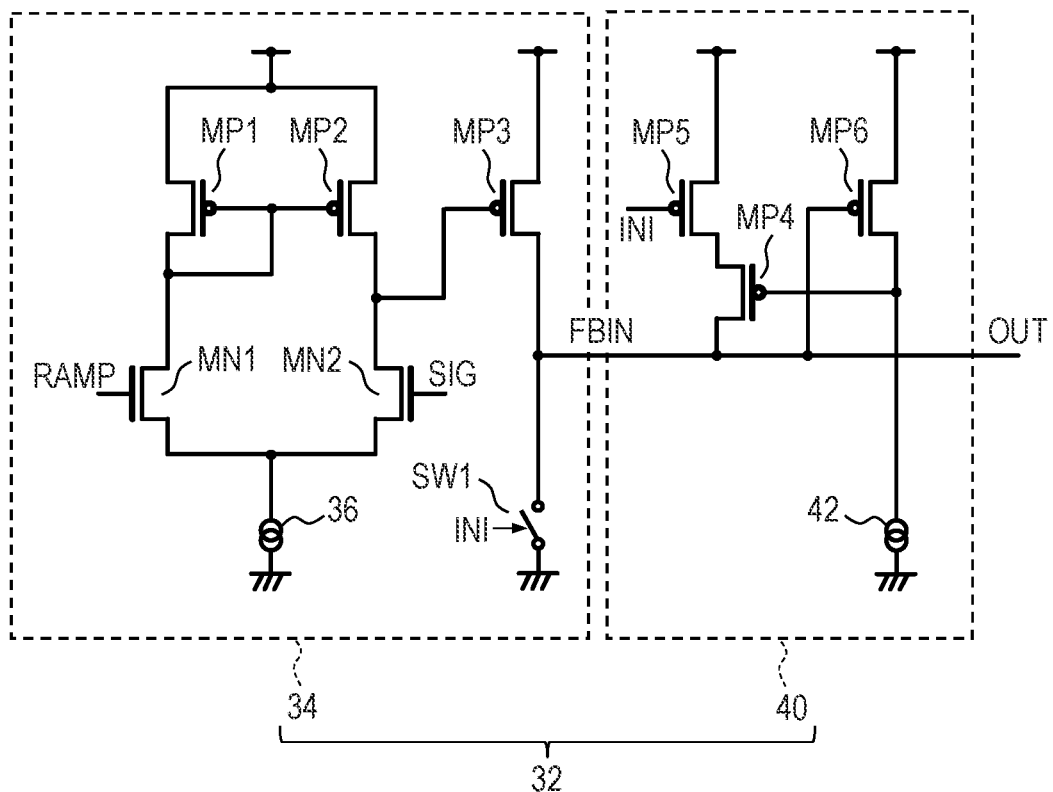
FIG. 6 is a circuit diagram illustrating a configuration example of a comparator in a photoelectric conversion device according to a second embodiment of the present invention.

A photoelectric conversion device according to a second embodiment of the present invention will be described with reference to FIG. 6. The same components as those of the photoelectric conversion device according to the first embodiment are labeled with the same references, and the description thereof will be omitted or simplified. FIG. 6 is a circuit diagram illustrating a configuration example of a comparator in the photoelectric conversion device according to the present embodiment.

The photoelectric conversion device according to the present embodiment is the same as the photoelectric conversion device according to the first embodiment except for a difference in the configuration of the comparator 32. That is, in the comparator 32 of the photoelectric conversion device according to the first embodiment, the node OUT, which is the output node of the positive feedback circuit 40, is provided to the connection node of the gate of the p-channel transistor MP4, the drain of the p-channel transistor MP6, and the current source 42, as illustrated in FIG. 3. In contrast, as illustrated in FIG. 6, in the comparator 32 of the photoelectric conversion device according to the present embodiment, the node OUT, which is the output node of the positive feedback circuit 40, is provided to the connection node between the drain of the p-channel transistor MP4 and the gate of the p-channel transistor MP6. In other words, the output node of the positive feedback circuit 40 is provided to the common node of the positive feedback circuit 40. The remaining features are the same as those of the comparator 32 of the photoelectric conversion device according to the first embodiment. In such a way, the comparator 32 of the present embodiment is configured to transfer the input of the positive feedback circuit 40 to the pulse generator 46 rather than to transfer the output of the positive feedback circuit 40 to the pulse generator 46 on the downstream stage.

With such a configuration of the positive feedback circuit 40, it is possible to reduce a load capacitance of the amplifier formed of the current source 42 and the p-channel transistor MP6 and further reduce current of the current source 42. Accordingly, it is possible to further suppress a potential fluctuation of the power supply voltage VDD or the reference voltage GND and reduce the AD conversion error.

As described above, according to the present embodiment, it is possible to suppress a fluctuation of the power supply voltage or the reference voltage in a comparator including a positive feedback circuit. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Third Embodiment

A photoelectric conversion device according to a third embodiment of the present invention will be described with reference to FIG. 7 and FIG. 8. The same components as those of the photoelectric conversion device according to the first and second embodiments are labeled with the same references, and the description thereof will be omitted or simplified.

Figure 7:
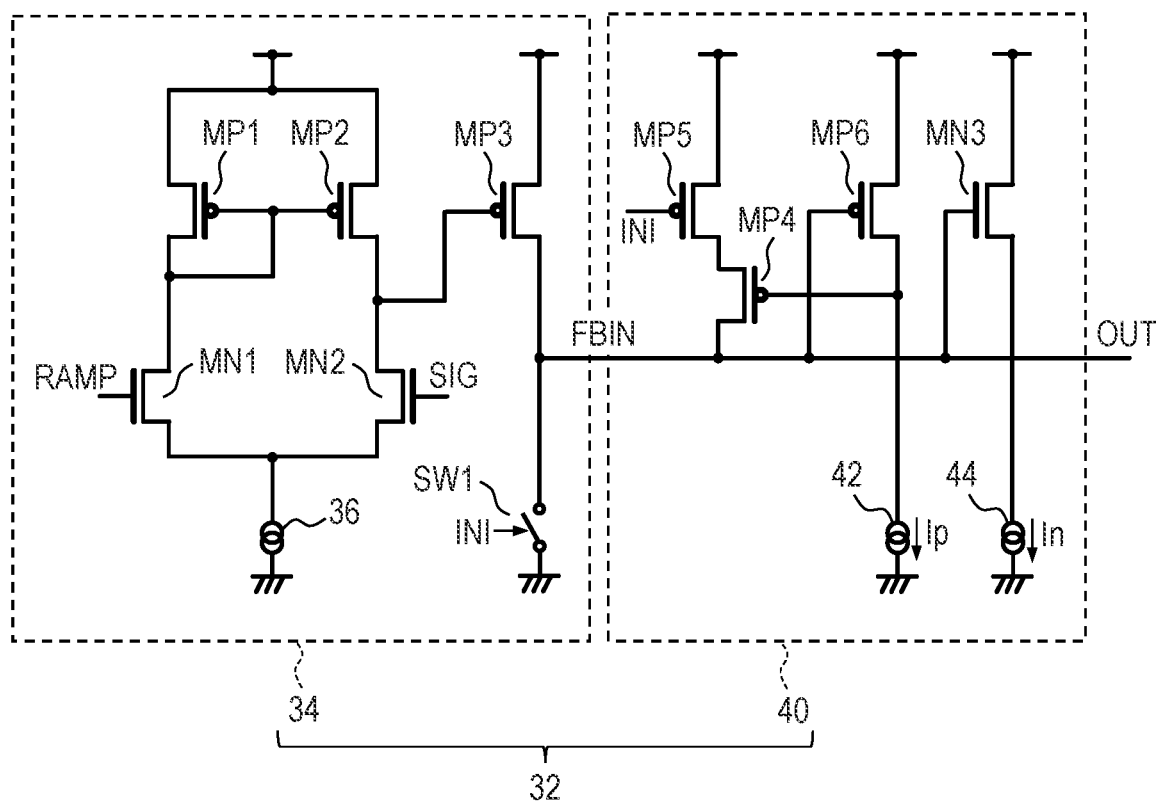
FIG. 7 is a circuit diagram illustrating a configuration example of a comparator in a photoelectric conversion device according to a third embodiment of the present invention.

FIG. 7 is a circuit diagram illustrating a configuration example of a comparator in the photoelectric conversion device according to the present embodiment.

The photoelectric conversion device according to the present embodiment is the same as the photoelectric conversion device according to the first and second embodiments except for a difference in the configuration of the comparator 32. That is, as illustrated in FIG. 7, in the comparator 32 of the photoelectric conversion device according to the present embodiment, the positive feedback circuit 40 further includes an n-channel transistor MN3 and a current source 44 in the positive feedback circuit 40 of the second embodiment. The remaining features are the same as those of the comparator 32 of the photoelectric conversion device according to the second embodiment. The re-channel transistor MN3 and the current source 44 form an amplifier unit of the positive feedback circuit 40 together with the p-channel transistor MP6 and the current source 42.

The drain of the n-channel transistor MN3 is connected to the power supply voltage node. The current source 44 is provided between the source of the n-channel transistor MN3 and the reference voltage node. The gate of the n-channel transistor MN3 is provided to the connection node between the drain of the p-channel transistor MP4 and the gate of the p-channel transistor MP6. In other words, the gate of the n-channel transistor MN3 is connected to the common node of the node FBIN, which is the input node of the positive feedback circuit 40, and the node OUT, which is the output node of the positive feedback circuit 40.

Figure 8:
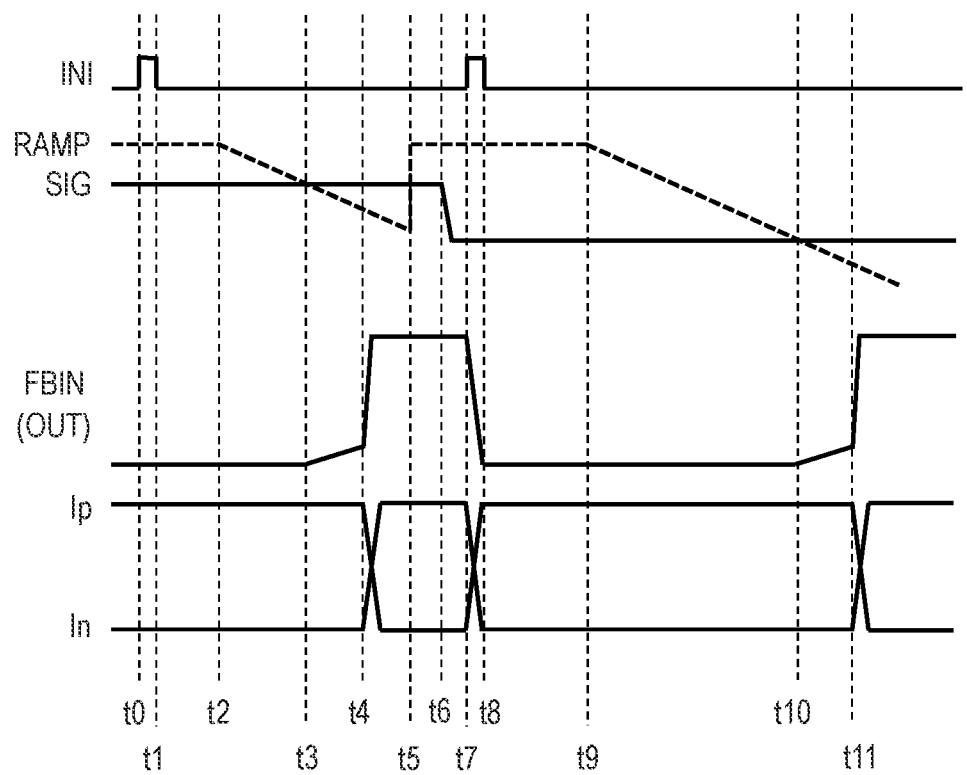
FIG. 8 is a timing diagram illustrating the operation of the comparator in the photoelectric conversion device according to the third embodiment of the present invention.

FIG. 8 is a timing diagram illustrating the operation of the comparator in the photoelectric conversion device according to the present embodiment. FIG. 8 illustrates the control signal INI, the reference signal RAMP, the signal SIG of the output line 16, the potential of the node FBIN, current Ip of the current source 42, and current In of the current source 44.

In the positive feedback circuit 40 of the present embodiment, the current source 42 and the current source 44 are set to have approximately the same current value. Further, the p-channel transistor MP6 and the n-channel transistor MN3 are transistors having opposite conductivities. Therefore, as illustrated in FIG. 8, when the potential of the node FBIN transitions at time t4, t7, and t11, the on-state/off-state of the p-channel transistor MP6 and the n-channel transistor MN3 is exchanged, and thereby both current fluctuations are cancelled or reduced. Accordingly, it is possible to further suppress the potential fluctuation of the power supply voltage VDD or the reference voltage GND and reduce the AD conversion error.

As described above, according to the present embodiment, it is possible to suppress a fluctuation of the power supply voltage or the reference voltage in a comparator including a positive feedback circuit. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Fourth Embodiment

Figure 9:
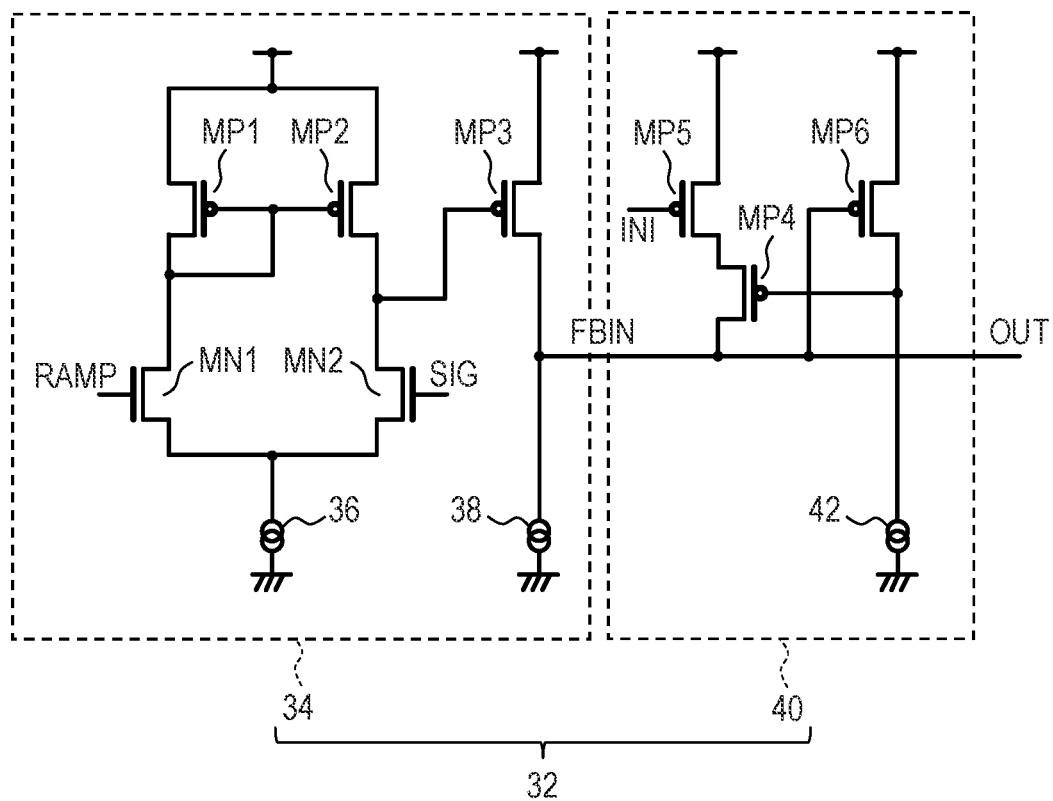
FIG. 9 is a circuit diagram illustrating a configuration example of a comparator in a photoelectric conversion device according to a fourth embodiment of the present invention.

A photoelectric conversion device according to a fourth embodiment of the present invention will be described with reference to FIG. 9. The same components as those of the photoelectric conversion device according to the first to third embodiments are labeled with the same references, and the description thereof will be omitted or simplified. FIG. 9 is a circuit diagram illustrating a configuration example of a comparator in the photoelectric conversion device according to the present embodiment.

The photoelectric conversion device according to the present embodiment is the same as the photoelectric conversion device according to the first to third embodiments except for a difference in the configuration of the comparator 32. That is, as illustrated in FIG. 9, the comparator 32 of the photoelectric conversion device according to the present embodiment includes a current source 38 instead of the switch SW1 of the comparison circuit 34 in the comparator 32 of the second embodiment. That is, the current source 38 instead of the switch SW1 is connected between the drain of the p-channel transistor MP3 and the reference voltage node. The amplifier unit of the comparison circuit 34 is formed of the p-channel transistor MP3 and the current source 38. The remaining features are the same as those of the comparator 32 of the second embodiment.

In the comparator 32 of the present embodiment, the current source 42 and the current source 38 are set to have approximately the same current value. Therefore, when the potential of the node FBIN transitions from the L level to the H level, instead of the p-channel transistor MP6 being turned off and the current of the current source 42 stopping flowing, the current of the current source 38 starts flowing, and the current fluctuations are cancelled or reduced. Accordingly, it is possible to further suppress the potential fluctuation of the power supply voltage VDD or the reference voltage GND and reduce the AD conversion error. Since the comparator 32 of the present embodiment can be formed of a smaller number of components than the comparator 32 of the third embodiment, there is an advantageous effect of a reduced circuit area of the comparator 32 compared to the third embodiment.

As described above, according to the present embodiment, it is possible to suppress a fluctuation of the power supply voltage or the reference voltage in a comparator including a positive feedback circuit. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Fifth Embodiment

Figure 10:
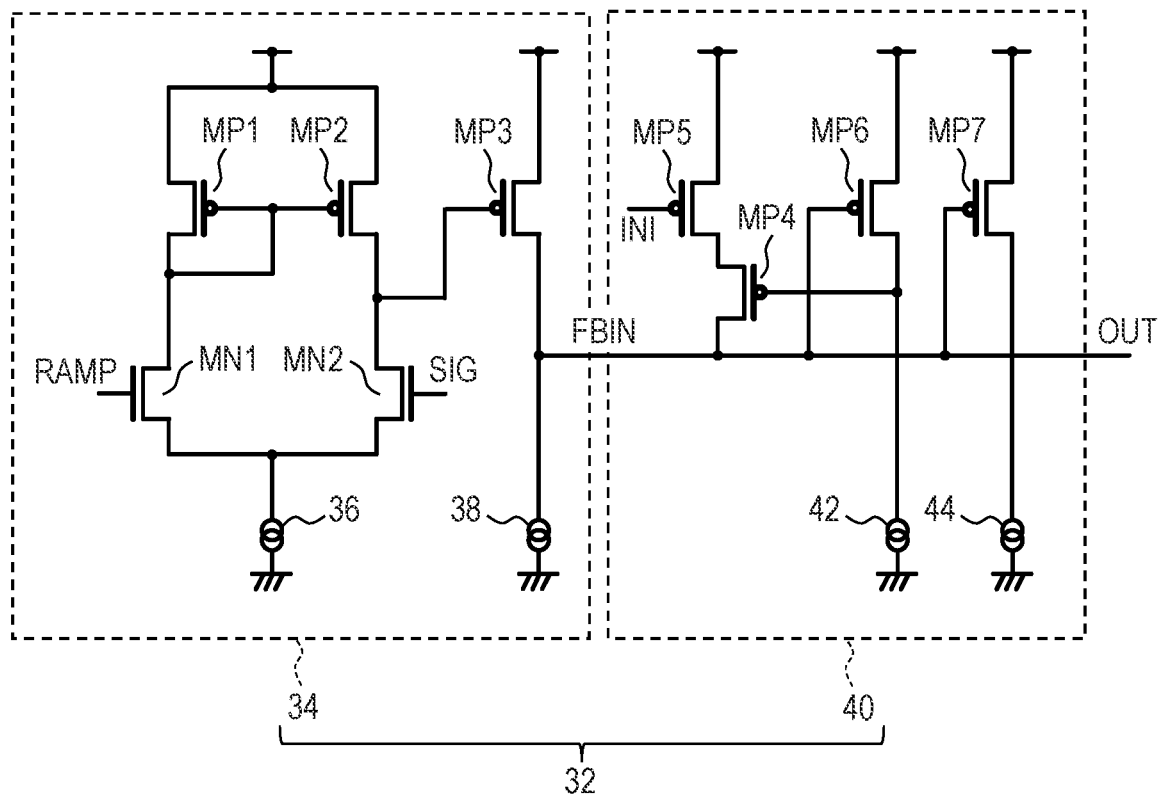
FIG. 10 is a circuit diagram illustrating a configuration example of a comparator in a photoelectric conversion device according to a fifth embodiment of the present invention.

A photoelectric conversion device according to a fifth embodiment of the present invention will be described with reference to FIG. 10. The same components as those of the photoelectric conversion device according to the first to fourth embodiments are labeled with the same references, and the description thereof will be omitted or simplified. FIG. 10 is a circuit diagram illustrating a configuration example of a comparator in the photoelectric conversion device according to the present embodiment.

The photoelectric conversion device according to the present embodiment is the same as the photoelectric conversion device according to the first to fourth embodiments except for a difference in the configuration of the comparator 32. That is, as illustrated in FIG. 10, in the comparator 32 of the photoelectric conversion device according to the present embodiment, the positive feedback circuit 40 further includes a p-channel transistor MP7 and the current source 44 in the positive feedback circuit 40 of the fourth embodiment. The p-channel transistor MP7 and the current source 44 form an amplifier unit of the positive feedback circuit 40 together with the p-channel transistor MP6 and the current source 42.

The source of the p-channel transistor MP7 is connected to the power supply voltage node. The current source 44 is provided between the drain of the p-channel transistor MP7 and the reference voltage node. The gate of the p-channel transistor MP7 is provided to the connection node between the drain of the p-channel transistor MP4 and the gate of the p-channel transistor MP6. In other words, the gate of the p-channel transistor MP7 is connected to the common node of the node FBIN, which is the input node of the positive feedback circuit 40, and the node OUT, which is the output node of the positive feedback circuit 40.

In the comparator 32 of the present embodiment, the sum of the current values of the current sources 42 and 44 is set to be approximately the same as the current value of the current source 38. Therefore, when the potential of the node FBIN transitions from the L level to the H level, instead of the p-channel transistors MP6 and MP7 being turned off and the current of the current sources 42 and 44 stopping flowing, the current of the current source 38 starts flowing, and the current fluctuations are cancelled or reduced. Accordingly, it is possible to further suppress the potential fluctuation of the power supply voltage VDD or the reference voltage GND and reduce the AD conversion error.

In the comparator 32 of the present embodiment, it is possible to separately optimize the current value of the current source 38 and the current values of the current sources 42 and 44. It is therefore possible to suppress a fluctuation of the power supply voltage VDD by setting the current value of the current source 42 to be relatively small to prevent excessively sharp switching from the off-state to the on-state of the p-channel transistor MP4, for example.

Further, it is possible to improve flexibility in operation timings because the current value of the current source 38 and the current values of the current sources 42 and 44 can be set separately. For example, the current source 38 and the current source 44 are set to have substantially the same current value, and the current value of the current source 42 is set to be significantly small. With such settings, it is possible to suppress the influence on current fluctuations to be smaller even when the timing of turning on of the p-channel transistor MP6 is shifted from the timing when current of the current source 38 starts flowing.

Note that, although the sum of the current values of the current sources 42 and 44 is the same as the current value of the current source 38 in the present embodiment, the p-channel transistor MP7 may be changed to an n-channel transistor, and the sum of the current values of the current sources 38 and 44 may be the same as the current value of the current source 42. In a case of such a configuration, the current source 42 is turned off when the current sources 38 and 44 are turned on, and current fluctuations can be cancelled or reduced.

As described above, according to the present embodiment, it is possible to suppress a fluctuation of the power supply voltage or the reference voltage in a comparator including a positive feedback circuit. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Sixth Embodiment

Figure 11:
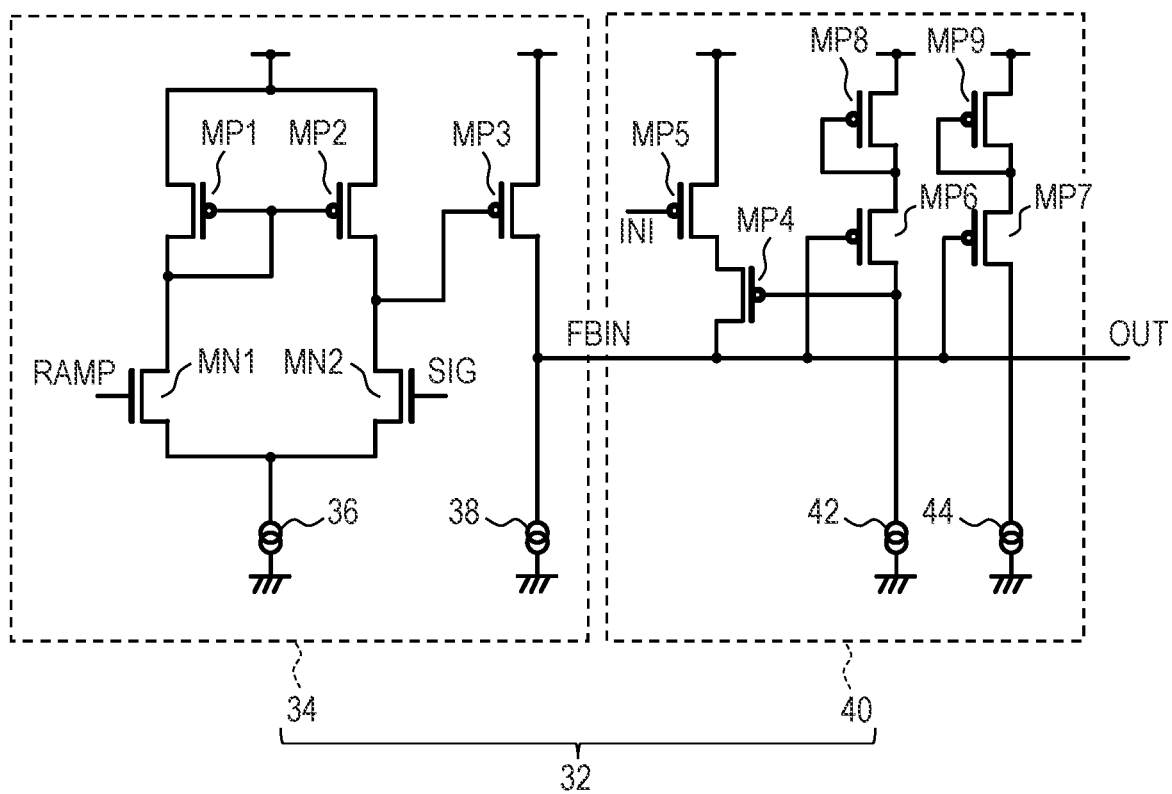
FIG. 11 is a circuit diagram illustrating a configuration example of a comparator in a photoelectric conversion device according to a sixth embodiment of the present invention.

A photoelectric conversion device according to a sixth embodiment of the present invention will be described with reference to FIG. 11. The same components as those of the photoelectric conversion device according to the first to fifth embodiments are labeled with the same references, and the description thereof will be omitted or simplified. FIG. 11 is a circuit diagram illustrating a configuration example of a comparator in the photoelectric conversion device according to the present embodiment.

The photoelectric conversion device according to the present embodiment is the same as the photoelectric conversion device according to the first to fifth embodiments except for a difference in the configuration of the comparator 32. That is, as illustrated in FIG. 11, in the comparator 32 of the photoelectric conversion device according to the present embodiment, the positive feedback circuit 40 further includes p-channel transistors MP8 and MP9 in the positive feedback circuit 40 of the fifth embodiment. The p-channel transistors MP8 and MP9 form an amplifier unit of the positive feedback circuit 40 together with the p-channel transistor MP6 and MP7 and the current sources 42 and 44.

The p-channel transistor MP8 is connected between the source of the p-channel transistor MP6 and the power supply voltage node. That is, the source of the p-channel transistor MP8 is connected to the power supply voltage node. The gate and the drain of the p-channel transistor MP8 are connected to the source of the p-channel transistor MP6. Further, the p-channel transistor MP9 is connected between the source of the p-channel transistor MP7 and the power supply voltage node. That is, the source of the p-channel transistor MP9 is connected to the power supply voltage node. The gate and the drain of the p-channel transistor MP9 are connected to the source of the p-channel transistor MP7.

The p-channel transistor MP8 is provided between the p-channel transistor MP6 and the power supply voltage node, and thereby the gate-source voltage Vgs of the p-channel transistor MP6 decreases by the gate-source voltage Vgs of the p-channel transistor MP8. Similarly, the p-channel transistor MP9 is provided between the p-channel transistor MP7 and the power supply voltage node, and thereby the gate-source voltage Vgs of the p-channel transistor MP7 decreases by the gate-source voltage Vgs of the p-channel transistor MP9. Accordingly, it is possible to reduce the off-leak current of the p-channel transistors MP6 and MP7 after the node FBIN transitions to the H level and suppress the relationship of current cancellation between the current sources 42 and 44 and the current source 38 from being compromised. As a result, it is possible to further suppress the potential fluctuation of the power supply voltage VDD or the reference voltage GND and reduce the AD conversion error.

As described above, according to the present embodiment, it is possible to suppress a fluctuation of the power supply voltage or the reference voltage in a comparator including a positive feedback circuit. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Note that, although the example in which the p-channel transistor MP8 and MP9 are further provided to the positive feedback circuit 40 of the fifth embodiment has been illustrated in the present embodiment, the p-channel transistor MP8 may be further provided to the positive feedback circuit 40 of the first to fourth embodiments.

Seventh Embodiment

A photoelectric conversion device according to a seventh embodiment of the present invention will be described with reference to FIG. 12 to FIG. 14. The same components as those of the photoelectric conversion device according to the first to sixth embodiments are labeled with the same references, and the description thereof will be omitted or simplified.

Although the configuration as the comparator 32 in which the signal SIG is input to the non-inverting input terminal of the comparison circuit 34 and the reference signal RAMP is input to the inverting input terminal of the comparison circuit 34 has been described in the previous embodiments, the configuration of the comparator 32 is not limited thereto. In the present embodiment, an example of a configuration in which the signal SIG is input to the inverting input terminal of the comparison circuit 34 and the reference signal RAMP is input to the non-inverting input terminal of the comparison circuit 34 will be described as a photoelectric conversion device including the comparator 32 having another configuration.

Figure 12:
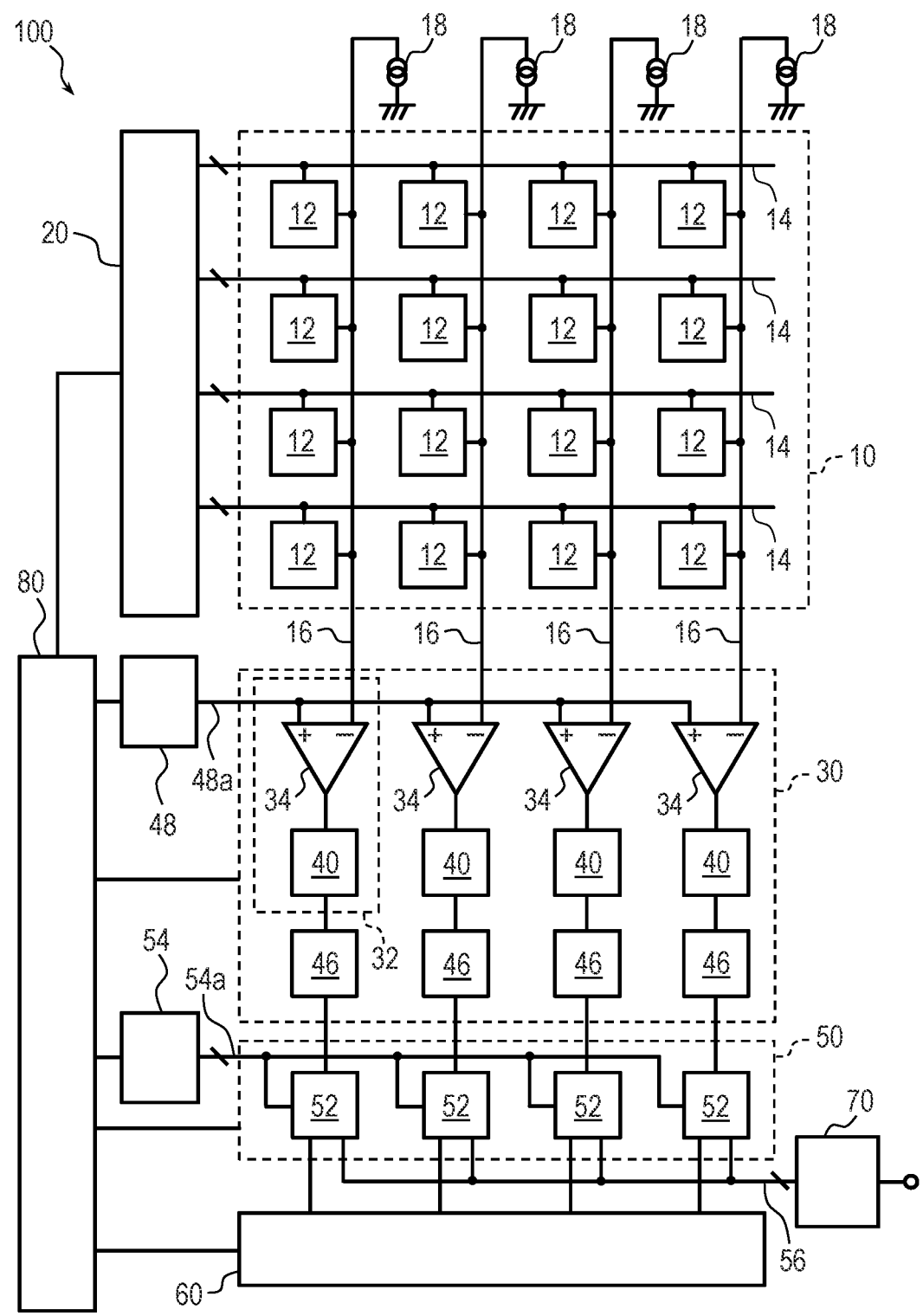
FIG. 12 is a block diagram illustrating a general configuration of a photoelectric conversion device according to a seventh embodiment of the present invention.

FIG. 12 is a block diagram illustrating a general configuration of the photoelectric conversion device according to the present embodiment. The general configuration of the photoelectric conversion device 100 according to the present embodiment is the same as that of the previous embodiments except that the output line 16 is connected to the inverting input terminal of the comparison circuit 34 and the reference signal line 48a is connected to the non-inverting input terminal of the comparison circuit 34, as illustrated in FIG. 12.

Figure 13:
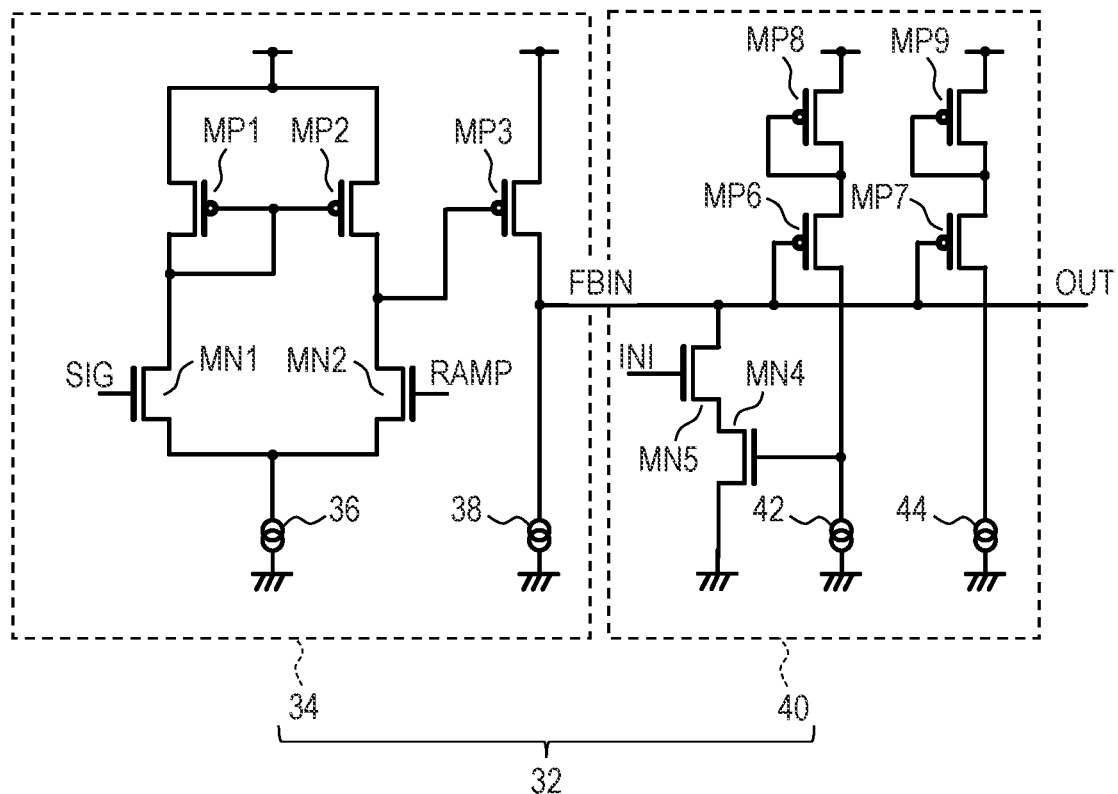
FIG. 13 is a circuit diagram illustrating a configuration example of a comparator in the photoelectric conversion device according to the seventh embodiment of the present invention.

FIG. 13 is a circuit diagram illustrating a configuration example of the comparator in the photoelectric conversion device according to the present embodiment. Although a configuration example corresponding to the comparator 32 of the sixth embodiment is illustrated in FIG. 13 as the comparator 32, the configuration corresponding to the comparator 32 of the first to fifth embodiments can also be applied.

In the comparator 32 of the present embodiment, the p-channel transistor MP4 and the p-channel transistor MP5 are replaced with the n-channel transistor MN4 and the n-channel transistor MN5 in conjunction with exchange of the input signal to the non-inverting input terminal with the input signal to the inverting input terminal. That is, the n-channel transistors MN4 and MN5 form a feedback unit of the positive feedback circuit 40.

The drain of the n-channel transistor MN5 is connected to the input node of the positive feedback circuit 40 (node FBIN). The source of the n-channel transistor MN5 is connected to the drain of the n-channel transistor MN4. The source of the n-channel transistor MN4 is connected to the reference voltage node. The gate of the n-channel transistor MN4 is connected to the connection node between the drain of the p-channel transistor MP6 and the current source 42. The n-channel transistor MN5 is controlled by the control signal INI supplied from the control circuit 80.

Figure 14:
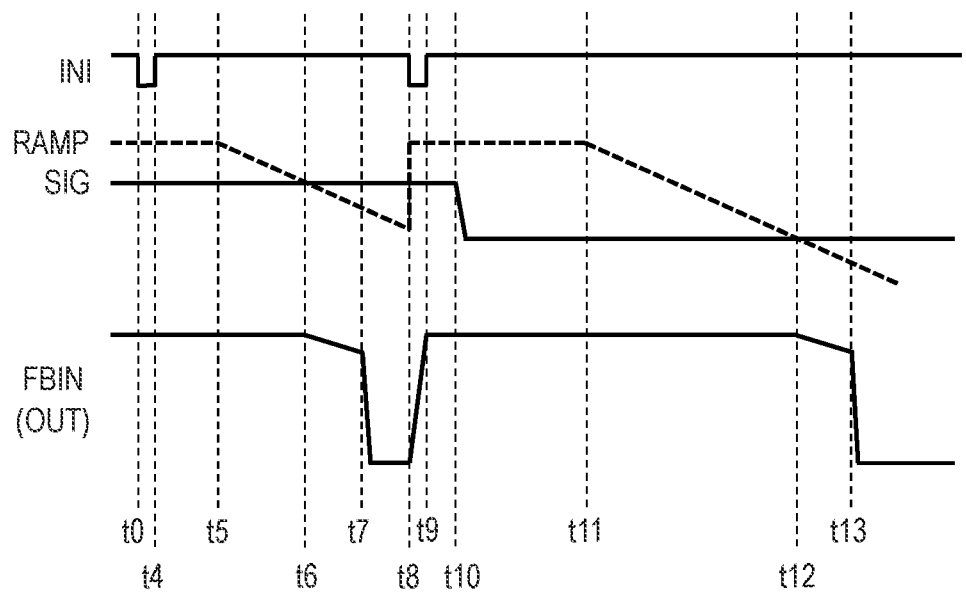
FIG. 14 is a timing diagram illustrating the operation of the comparator in the photoelectric conversion device according to the seventh embodiment of the present invention.

FIG. 14 is a timing diagram illustrating the operation of the comparator in the photoelectric conversion device according to the present embodiment. FIG. 14 illustrates the control signal INI, the reference signal RAMP, the signal SIG of the output line 16, and the potential of the node FBIN (node OUT).

In the period before time t0, the control signal INI is at the H level. Further, a signal in accordance with a reset level of the pixel 12 (noise signal) has been output as the signal SIG to the output line 16. Further, the reference level of the reference signal RAMP before the change in the potential level is started is higher than the level of the signal SIG in accordance with the reset level of the pixel 12.

First, in the period from time t0 to time t4, the control circuit 80 controls the control signal INI from the H level to the L level. Thereby, the n-channel transistor MN5 is turned off, and the node FBIN is at the H level.

At subsequent time t5, the reference signal generation circuit 48 starts changing the potential level of the reference signal RAMP. The reference signal generation circuit 48 outputs the reference signal RAMP having a ramp waveform whose potential gradually decreases with time, for example. Further, the counter circuit 54 starts count in synchronization with the start of the change in the potential level of the reference signal RAMP and outputs a count signal indicating a count value to the count signal line 54a.

At subsequent time t6, it is assumed that the level of the reference signal RAMP decreases below the level of the signal SIG in accordance with the reset level of the pixel 12. In response, the gate potential of the p-channel transistor MP3 starts increasing gradually from time t6, and thereby the potential of the node FBIN starts decreasing gradually.

Accordingly, at subsequent time t7, the n-channel transistor MN4 is turned on. In response, the n-channel transistor MM enters the on-state, the node FBIN and the reference voltage node are connected to each other, thereby positive feedback is applied to the potential of the node FBIN, and the potential of the node FBIN (node OUT) decreases rapidly.

In response to the rapid change in the potential of the node OUT, the pulse generator 46 generates and outputs one shot of pulse to the memory 52. The memory 52 holds a count value, which is indicated by a count signal being output from the counter circuit 54 at the timing of receiving the pulse from the pulse generator 46, as digital data of the signal SIG in accordance with the reset level of the pixel 12, that is, digital data of a noise signal.

At subsequent time t8, the reference signal generation circuit 48 resets the potential level of the reference signal RAMP to the reference level.

In the subsequent period from time t8 to time t9, the control circuit 80 controls the control signal INI from the H level to the L level. Thereby, the n-channel transistor MN5 is turned off, and the node FBIN reaches the H level.

At subsequent time t10, signal charge of the pixel 12 to be read out are transferred to the floating diffusion portion FD, thereby a signal in accordance with the amount of signal charge (light detection signal) is output as the signal SIG, and the level of the signal SIG of the output line 16 is reduced.

At subsequent time t11, the reference signal generation circuit 48 starts changing the potential level of the reference signal RAMP. Further, the counter circuit 54 newly starts count in synchronization with the start of the change in the potential level of the reference signal RAMP and outputs a count signal indicating a count value to the count signal line 54a.

At subsequent time t12, it is assumed that the level of the reference signal RAMP decreases below the level of the signal SIG in accordance with the amount of signal charge. In response, the gate potential of the p-channel transistor MP3 starts increasing gradually from time t12, and thereby the potential of the node FBIN starts decreasing gradually.

Accordingly, at subsequent time t13, the n-channel transistor MN4 is turned on. In response, the n-channel transistor MM enters the on-state, the node FBIN and the reference voltage node are connected to each other, thereby positive feedback is applied to the potential of the node FBIN, and the potential of the node FBIN (node OUT) decreases rapidly.

In response to the rapid change in the potential of the node OUT, the pulse generator 46 generates and outputs one shot of pulse to the memory 52. The memory 52 holds a count value, which is indicated by a count signal being output from the counter circuit 54 at the timing of receiving the pulse from the pulse generator 46, as digital data of the signal SIG in accordance with the amount of signal charge, that is, digital data of a light detection signal.

Also in the comparator 32 of the present embodiment, the sum of the current values of the current sources 42 and 44 is set to be approximately the same as the current value of the current source 38. Therefore, when the potential of the node FBIN transitions from the H level to the L level, instead of the current of the current source 38 stopping flowing, the p-channel transistors MP6 and MP7 are turned on and the current of the current sources 42 and 44 starts flowing, and the current fluctuations are cancelled or reduced. Accordingly, it is possible to further suppress the potential fluctuation of the power supply voltage VDD or the reference voltage GND and reduce the AD conversion error.

As described above, according to the present embodiment, it is possible to suppress a fluctuation of the power supply voltage or the reference voltage in a comparator including a positive feedback circuit. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Eighth Embodiment

A photoelectric conversion device according to an eighth embodiment of the present invention will be described with reference to FIG. 15 and FIG. 16. The same components as those of the photoelectric conversion device according to the first to seventh embodiments are labeled with the same references, and the description thereof will be omitted or simplified.

Figure 15:
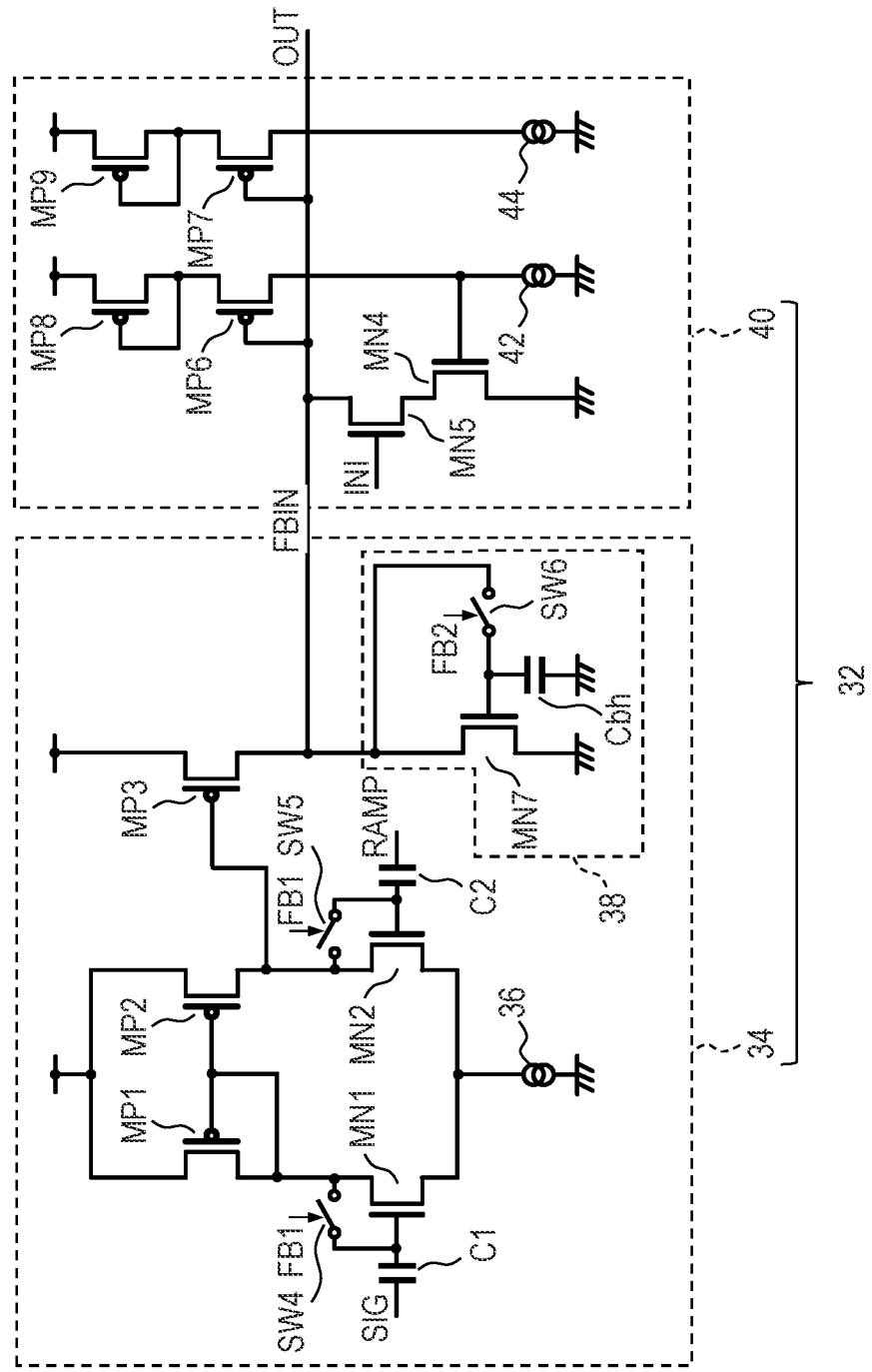
FIG. 15 is a circuit diagram illustrating a configuration example of a comparator in a photoelectric conversion device according to an eighth embodiment of the present invention.

FIG. 15 is a circuit diagram illustrating a configuration example of a comparator in the photoelectric conversion device according to the present embodiment. The photoelectric conversion device according to the present embodiment is the same as the photoelectric conversion device according to the seventh embodiment except for a difference in the configuration of the comparison circuit 34.

That is, as illustrated in FIG. 15, the comparison circuit 34 in the photoelectric conversion device of the present embodiment further includes switches SW4 and SW5 and clamp capacitors C1 and C2 in addition to the comparison circuit 34 of the seventh embodiment. The switch SW4 is connected between the gate and the drain of the n-channel transistor MN1. The signal SIG is supplied to the gate of the n-channel transistor MN1 via the clamp capacitor C1. The switch SW5 is connected between the gate and the drain of the n-channel transistor MN2. The reference signal RAMP is supplied to the gate of the n-channel transistor MN2 via the clamp capacitor C2. Each of the switches SW4 and SW5 is a switch whose connection state (conduction or non-conduction) is controlled by the control signal FB1 supplied from the control circuit 80.

Further, the current source 38 of the comparison circuit 34 in the photoelectric conversion device of the present embodiment includes an n-channel transistor MN7, a bias hold capacitor Cbh, and a switch SW6, as illustrated in FIG. 15. The drain of the n-channel transistor MN7 is connected to the drain of the p-channel transistor MP3. The source of the n-channel transistor MN7 is connected to the reference voltage node. The gate of the n-channel transistor is connected to one of the electrodes of the bias hold capacitor Cbh. The other electrode of the bias hold capacitor Cbh is connected to the reference voltage node. Further, the switch SW6 is connected between the gate of the n-channel transistor MN7 and the connection node of the drain of the re-channel transistor MN7 and the drain of the p-channel transistor MP3. The switch SW6 is a switch whose connection state (conduction or non-conduction) is controlled by the control signal FB2 supplied from the control circuit 80.

With such a configuration of the comparison circuit 34, the comparison circuit 34 can have an offset cancellation function.

Figure 16:
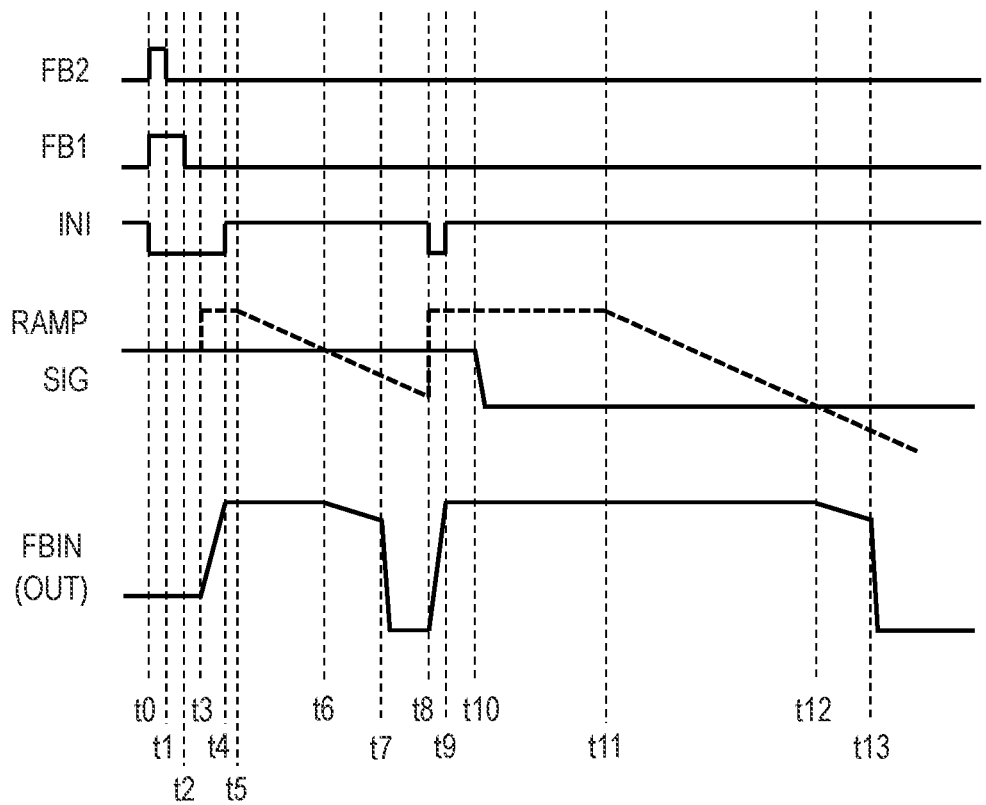
FIG. 16 is a timing diagram illustrating the operation of the comparator in the photoelectric conversion device according to the eighth embodiment of the present invention.

FIG. 16 is a timing diagram illustrating the operation of the comparator in the photoelectric conversion device according to the present embodiment. FIG. 16 illustrates the control signals FB2, FB1, and INI, the reference signal RAMP, the signal SIG of the output line 16, and the potential of the node FBIN (node OUT).

In the period before time t0, the control signals FB2 and FB1 are at the L level, and the control signal INI is at the H level. Further, a signal in accordance with the reset level of the pixel 12 (noise signal) is output to the output line 16 as the signal SIG.

First, at time t0, the control circuit 80 controls the control signal INI from the H level to the L level to turn off the n-channel transistor MN5. Further, at the same time t0, the control circuit 80 controls the control signals FB1 and FB2 from the L level to the H level to turn on the switches SW4, SW5, and SW6. Accordingly, if the p-channel transistors MP1, MP2, and MP3 all have the same size, current having a current value that is the same as the half the current value of the tail current source 36 flows in the p-channel transistor MP3. As a result, the gate-source voltage Vgs of the p-channel transistor MP3 in accordance with the current amount is held in the bias hold capacitor Cbh. Further, the potential that is a reference to the signal SIG and the reference signal RAMP is clamped in the clamp capacitors C1 and C2.

At subsequent time t1, the control circuit 80 controls the control signal FB2 from the H level to the L level. Thereby, the switch SW6 transitions from the on-state to the off-state.

At subsequent time t2, the control circuit 80 controls the control signal FB1 from the H level to the L level. Thereby, the switches SW4 and SW5 transition from the on-state to the off-state.

At subsequent time t3, the reference signal generation circuit 48 increases the potential of the reference signal RAMP by a predetermined voltage. Thereby, the potential of the node FBIN increases gradually. The potential of the node FBIN increases, and thereby, at time t4, the p-channel transistor MP6 transitions from the on-state to the off-state.

Next, at time t4 when the p-channel transistor MP6 is turned off, the control circuit 80 controls the control signal INI to transition from the L level to the H level to turn on the n-channel transistor MN5.

At subsequent time t5, the reference signal generation circuit 48 starts changing the potential level of the reference signal RAMP. The reference signal generation circuit 48 outputs the reference signal RAMP having a ramp waveform whose potential gradually decreases with time, for example. Further, the counter circuit 54 starts count in synchronization with the start of the change in the potential level of the reference signal RAMP and outputs a count signal indicating a count value to the count signal line 54a.

At subsequent time t6, it is assumed that the level of the reference signal RAMP decreases below the level of the signal SIG in accordance with the reset level of the pixel 12. In response, the gate potential of the p-channel transistor MP3 starts increasing gradually from time t6, and thereby the potential of the node FBIN starts decreasing gradually.

In the present embodiment, because of the clamping operation, an inversion operation of the comparison circuit 34 starts from time t6 when the level of the reference signal RAMP becomes the same as that on and before time t3 regardless of variation of the thresholds of the n-channel transistors MN1, MN2, and the like (offset of the comparison circuit 34). That is, with the use of the comparator 32 of the present embodiment, it is possible to cancel influence due to the offset of the comparison circuit 34.

Since the operation on and after subsequent time t6 is the same as that of the seventh embodiment, the description thereof will be omitted here.

As described above, according to the present embodiment, it is possible to suppress a fluctuation of the power supply voltage or the reference voltage in a comparator including a positive feedback circuit. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Ninth Embodiment

Figure 17:
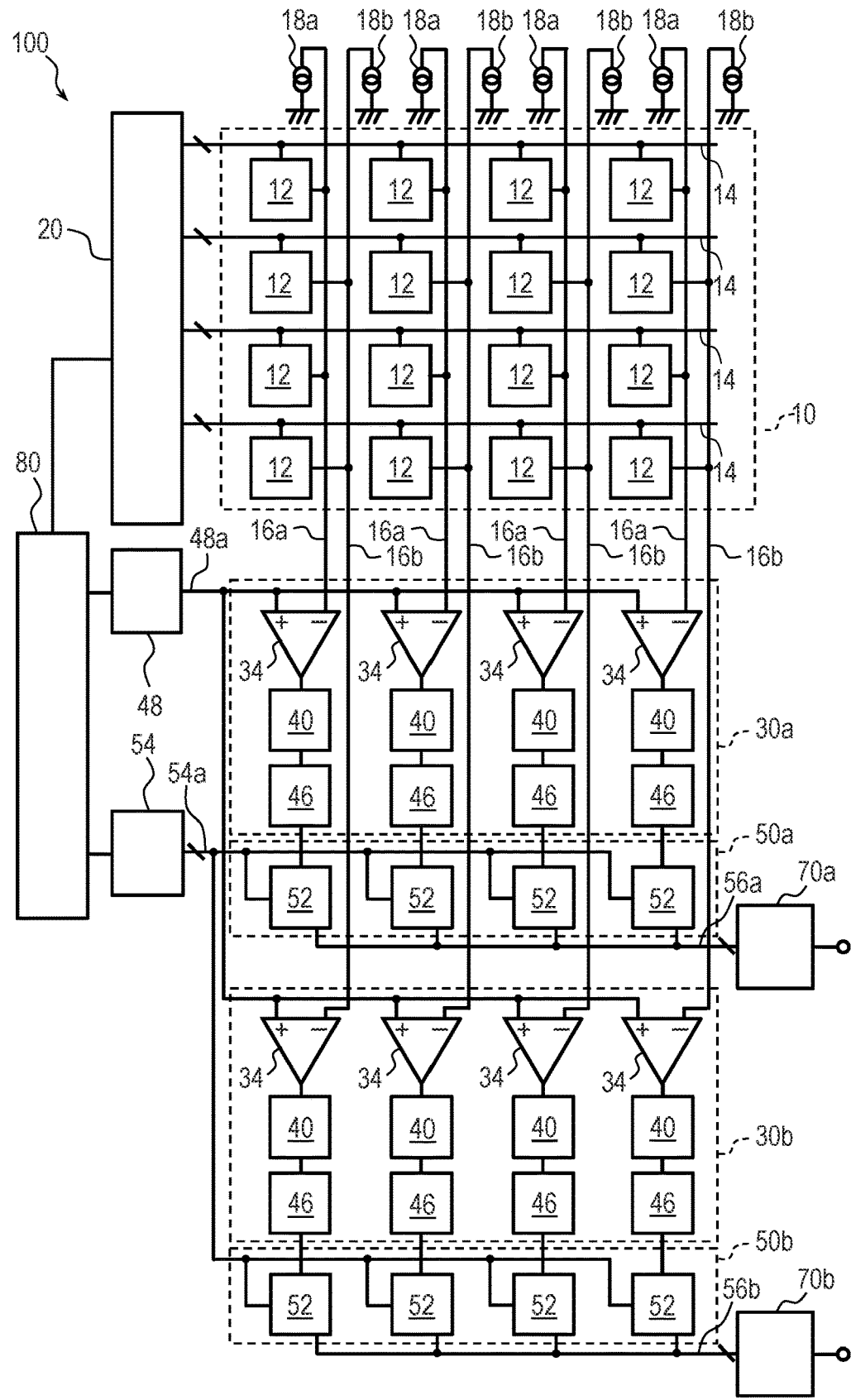
FIG. 17 is a block diagram illustrating a general configuration of a photoelectric conversion device according to a ninth embodiment of the present invention (Part 1).
Figure 18:
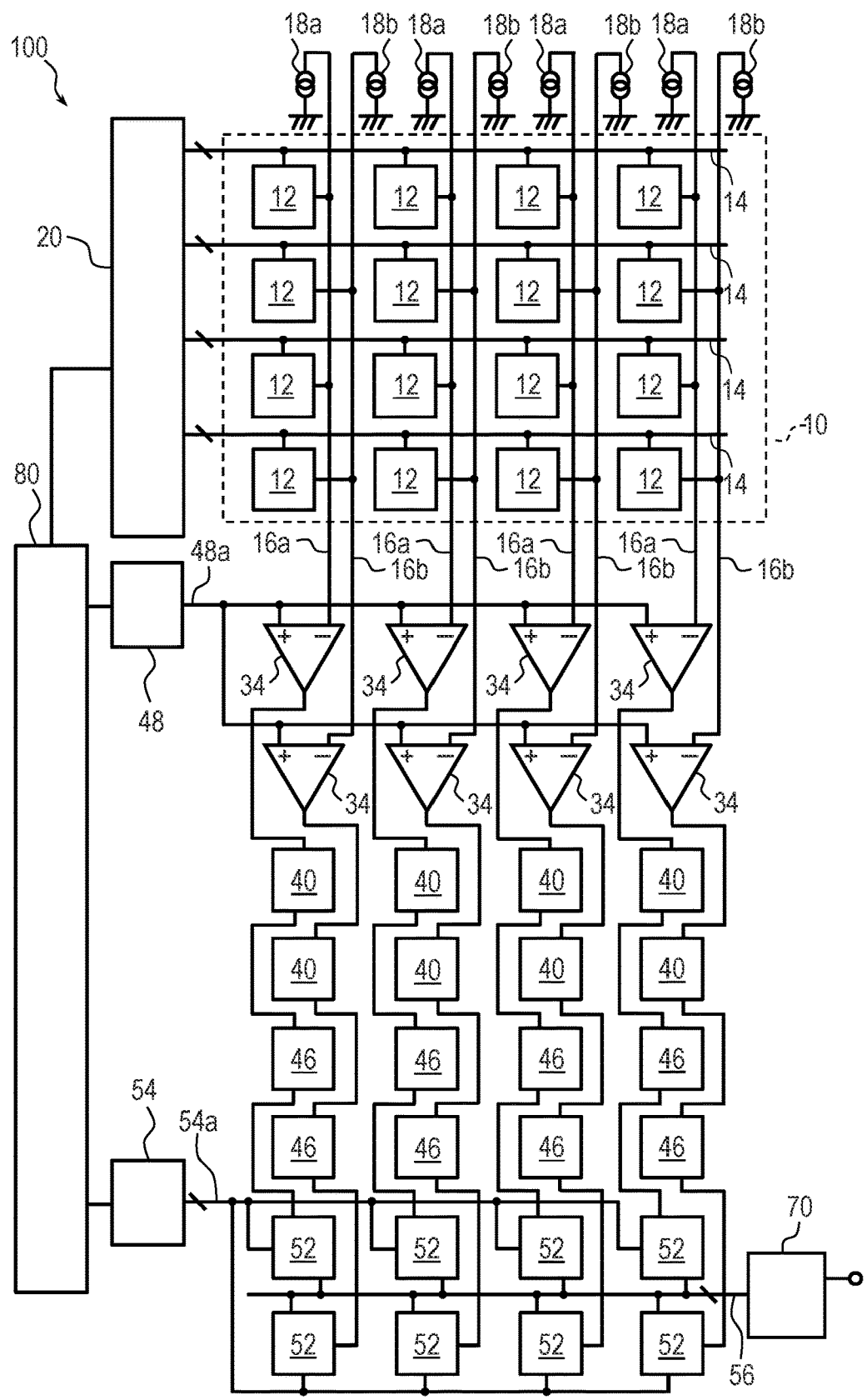
FIG. 18 is a block diagram illustrating a general configuration of a photoelectric conversion device according to the ninth embodiment of the present invention (Part 2).

A photoelectric conversion device according to a ninth embodiment of the present invention will be described with reference to FIG. 17 and FIG. 18. The same components as those of the photoelectric conversion device according to the first to eighth embodiments are labeled with the same references, and the description thereof will be omitted or simplified. FIG. 17 and FIG. 18 are block diagrams illustrating the general configuration of the photoelectric conversion device according to the present embodiment.

Although the photoelectric conversion device configured such that a single output line 16 is arranged on each column and pixel signals are read out on a row basis has been illustrated in the first to eighth embodiments, it is also possible to apply a configuration in which a plurality of output lines 16 are arranged on each column and pixel signals for a plurality of rows are simultaneously read out. In the present embodiment, a photoelectric conversion device in which a plurality of output lines 16 are arranged on each column and pixel signals for a plurality of rows can be simultaneously read out will be described.

In the photoelectric conversion device 100 according to the present embodiment, as illustrated in FIG. 17 and FIG. 18, two output lines 16a and 16b are arranged on each column of the pixel array unit 10, and the pixels 12 connected to the output line 16a and the pixels 12 connected to the output line 16b are divided on a row basis. Note that, in FIG. 17 and FIG. 18, illustration of the horizontal scanning circuit 60 is omitted to simplify the drawings.

In the configuration example illustrated in FIG. 17, two sets of readout circuits each formed of the AD conversion circuit unit 30, the memory unit 50, and the output circuit 70 are provided in association with the output lines 16a and 16b. That is, the readout circuit connected to the output line 16a is formed of an AD conversion circuit unit 30a, a memory unit 50a, and an output circuit 70a. Further, the readout circuit connected to the output line 16b is formed of an AD conversion circuit unit 30b, a memory unit 50b, and an output circuit 70b. By providing two sets of the readout circuit, it is possible to read out the pixel signals of the pixels 12 of the pixel array unit 10 simultaneously for two rows and realize a fast readout operation. Note that, although the two sets of readout circuits are arranged on one side of the pixel array unit 10 in the configuration example illustrated in FIG. 17, the two sets of readout circuits may be arranged so as to interpose the pixel array unit 10.

The configuration example illustrated in FIG. 18 is the same as the configuration example illustrated in FIG. 17 in terms of a circuit. The configuration example illustrated in FIG. 18 differs from the configuration example illustrated in FIG. 17 in that circuit blocks belonging to a different set of readout circuit and having the same function are arranged close to each other. That is, the comparison circuit 34 of the readout circuit connected to the output line 16a and the comparison circuit 34 of the readout circuit connected to the output line 16b are arranged close to each other. Further, the positive feedback circuit 40 of the readout circuit connected to the output line 16a and the positive feedback circuit 40 of the readout circuit connected to the output line 16b are arranged close to each other. Further, the pulse generator 46 of the readout circuit connected to the output line 16a and the pulse generator 46 of the readout circuit connected to the output line 16b are arranged close to each other. Further, the memory 52 of the readout circuit connected to the output line 16a and the memory 52 of the readout circuit connected to the output line 16b are arranged close to each other. Circuit blocks arranged close to each other are not necessarily required to be all the circuit blocks forming the readout circuit, and only some of the circuit blocks may be arranged close to each other. In particular, since the comparison circuits 34 and the positive feedback circuits 40 much affect the AD conversion error, it is desirable to arrange the comparison circuits 34 close to each other and arrange the positive feedback circuits 40 close to each other. By arranging circuit blocks having the same function close to each other in such a way, it is possible to increase relative accuracy between these circuit blocks and reduce the AD conversion error due to belonging to different readout circuits.

Note that, although FIG. 18 illustrates the example in which circuit blocks having the same function are arranged close to each other, it is more preferable to arrange circuit blocks having the same function close to each other on a circuit element basis, for example, on a transistor basis. With such a configuration, it is possible to suppress variation of circuit characteristics due to in-plane variation of element characteristics and further increase relative accuracy between circuit blocks having the same function.

Further, although two output lines 16a and 16b are arranged on each column of the pixel array unit 10 in the configuration examples of FIG. 17 and FIG. 18, three or more output lines 16 may be arranged on each column of the pixel array unit 10 to enable simultaneous readout of three or more rows.

As described above, according to the present embodiment, it is possible to suppress a fluctuation of the power supply voltage or the reference voltage in a comparator including a positive feedback circuit. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Tenth Embodiment

A photoelectric conversion device according to a tenth embodiment of the present invention will be described with reference to FIG. 19 to FIG. 22. The same components as those of the photoelectric conversion device according to the first to ninth embodiments are labeled with the same references, and the description thereof will be omitted or simplified. FIG. 19 to FIG. 22 are circuit diagrams illustrating configuration examples of comparators of the photoelectric conversion device according to the present embodiment.

In the present embodiment, an example interconnection arrangement to a GND pad connected to the comparator 32 will be described. Although description will be provided here with the circuit configuration of the eighth embodiment, the same applies to the circuit configuration of another embodiment.

In FIG. 19 to FIG. 22, a GND pad 90 is a pad electrode connected to the reference voltage node. The pad electrode is an electrode used for connecting an interconnection outside the photoelectric conversion device 100 to the photoelectric conversion device 100.

Figure 19:
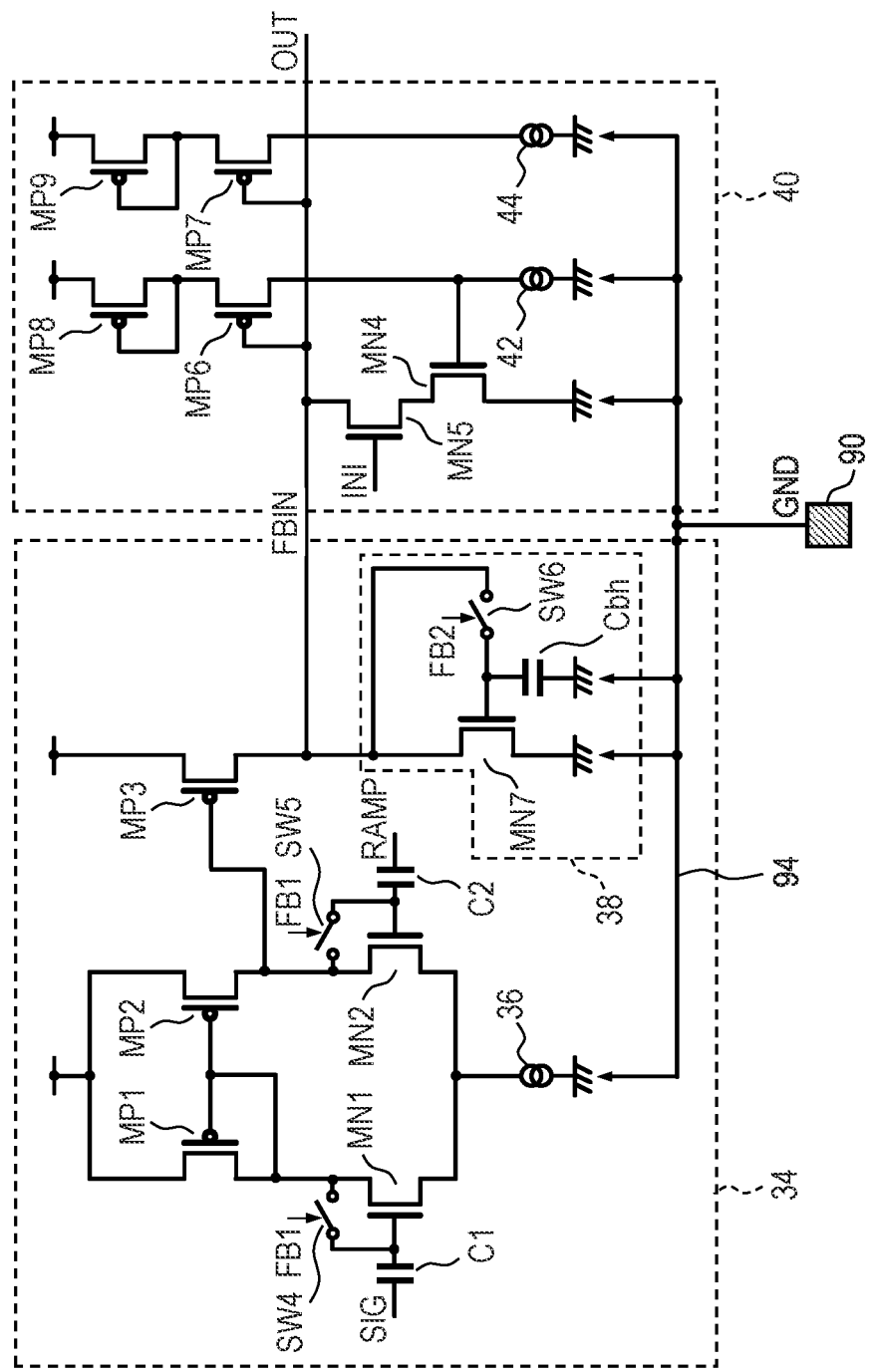
FIG. 19 is a circuit diagram illustrating a configuration example of a comparator in a photoelectric conversion device according to a tenth embodiment of the present invention (Part 1).

In the configuration example illustrated in FIG. 19, all the reference voltage nodes of the comparison circuit 34 and the positive feedback circuit 40 are connected to a common interconnection 94, and the interconnection 94 is connected to the common GND pad 90. By connecting all the reference voltage nodes to the common interconnection 94, it is possible to connect the reference voltage node to the GND pad 90 by a wire at a lower impedance.

Figure 20:
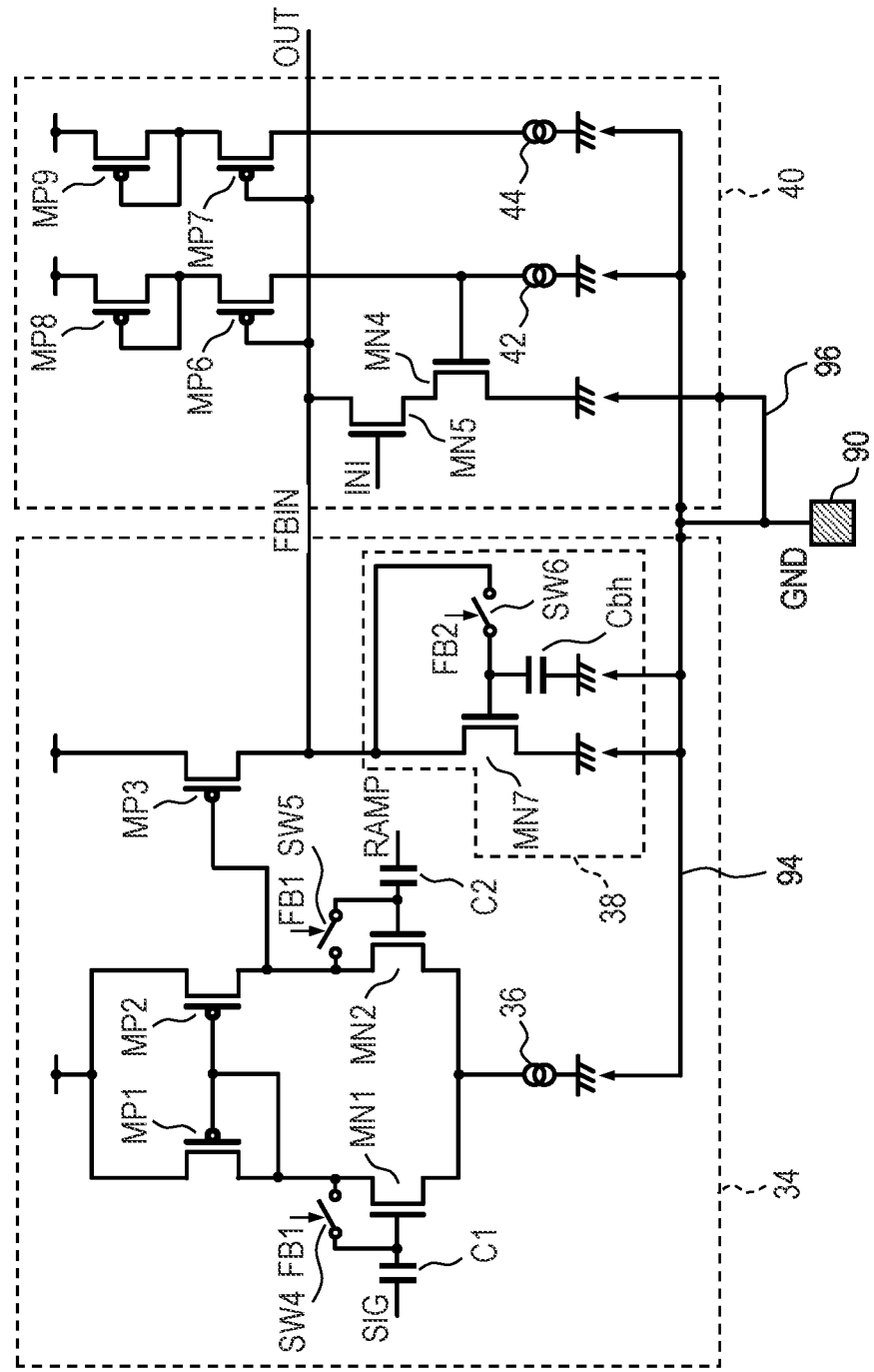
FIG. 20 is a circuit diagram illustrating a configuration example of a comparator in the photoelectric conversion device according to the tenth embodiment of the present invention (Part 2).

In the configuration example illustrated in FIG. 20, an interconnection 96 connecting the reference voltage node of the source of the n-channel transistor MN4 to the GND pad 90 and an interconnection 94 connecting the remaining reference voltage nodes to the GND pad are separately provided. In the case of such a configuration, although the impedance of an individual interconnection may increase, interference between circuit elements can be suppressed. For example, it is possible to suppress a fluctuation of current of the n-channel transistor MN7 due to a fluctuation of the reference voltage GND caused by turning on of the n-channel transistor MN4.

Figure 21:
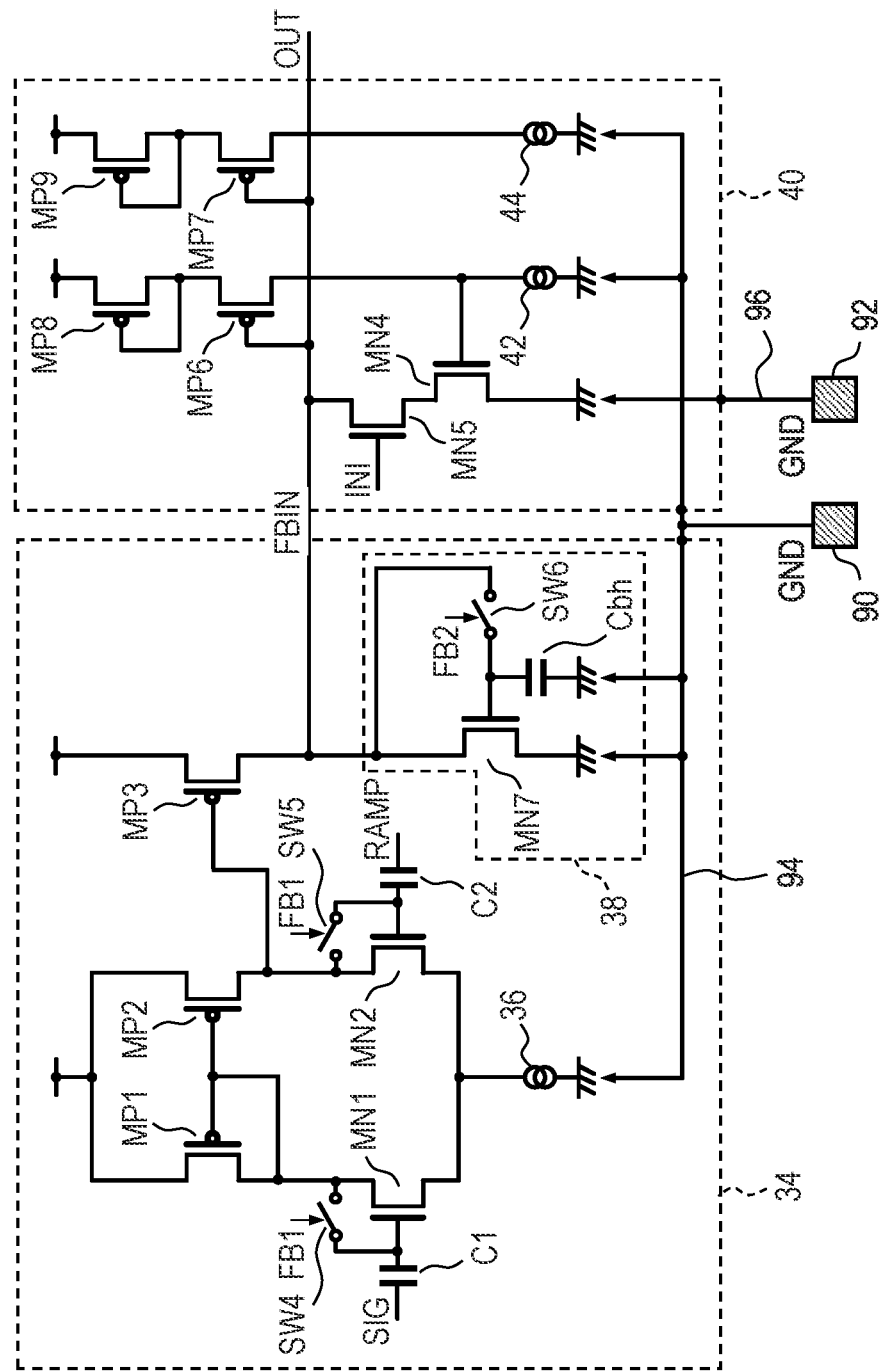
FIG. 21 is a circuit diagram illustrating a configuration example of a comparator in the photoelectric conversion device according to the tenth embodiment of the present invention (Part 3).

In the configuration example illustrated in FIG. 21, the pad electrode is divided into a GND pad 90 connected to the interconnection 94 and a GND pad 92 connected to the interconnection 96 in the configuration example of FIG. 20. With such a configuration, it is possible to further suppress interference between circuit elements.

Figure 22:
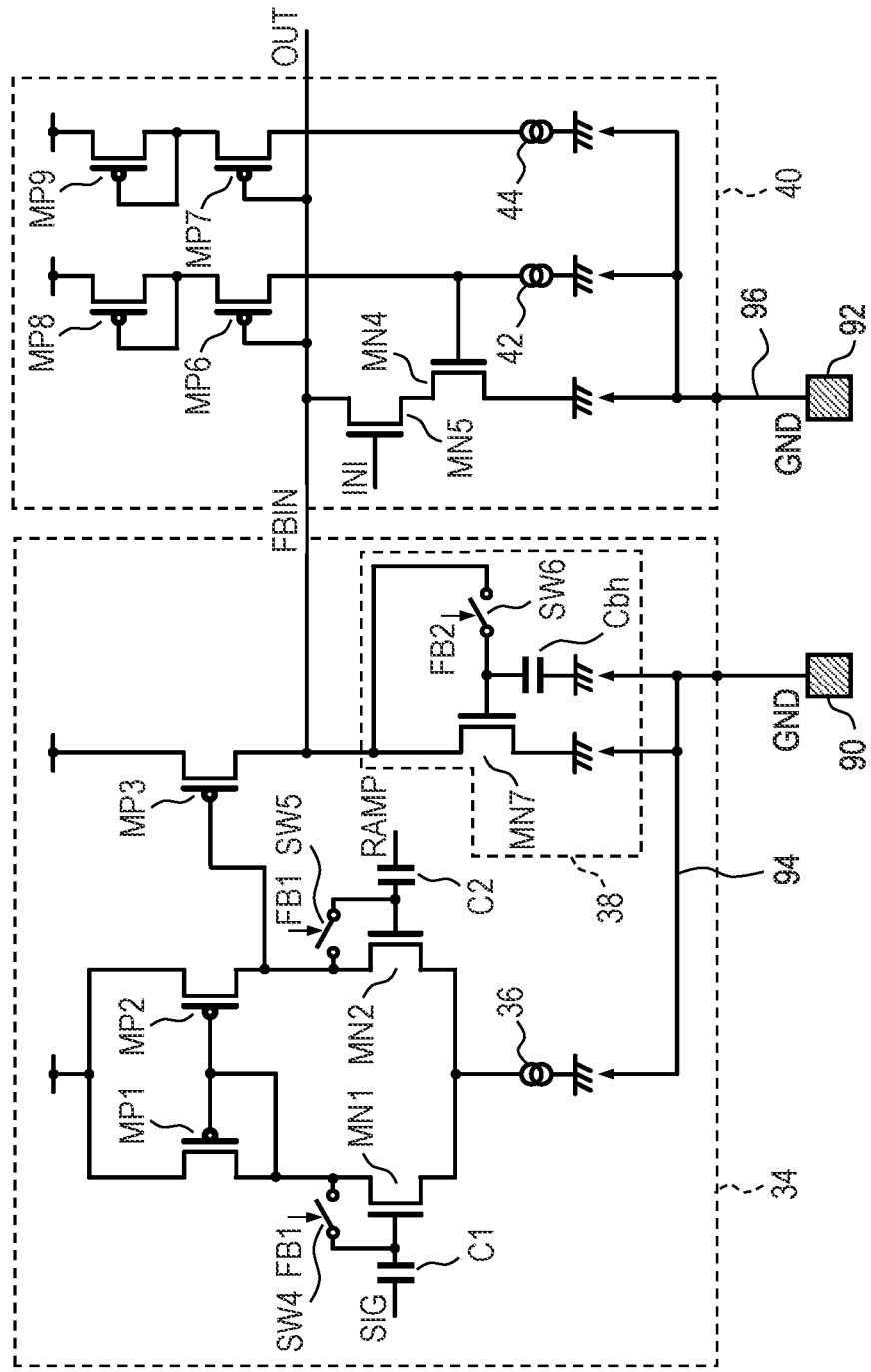
FIG. 22 is a circuit diagram illustrating a configuration example of a comparator in the photoelectric conversion device according to the tenth embodiment of the present invention (Part 4).

In the configuration example illustrated in FIG. 22, all the reference voltage nodes of the comparison circuit 34 are connected to the GND pad 90 via the common interconnection 94, and all the reference voltage nodes of the positive feedback circuit 40 are connected to the GND pad 92 via the common interconnection 96. In the case of such a configuration, it is possible to suppress interference between the comparison circuit 34 and the positive feedback circuit 40. When circuit blocks having the same function are arranged close to each other as illustrated in FIG. 18, for example, such wire connection is preferable.

Note that interconnection arrangement between the reference voltage node and the GND pad is not limited to the examples described above and can be changed as appropriate in accordance with the circuit configuration employed for the comparison circuit 34 or the positive feedback circuit 40, the arrangement of the circuit blocks as illustrated in FIG. 17 and FIG. 18, or the like. Further, although the example of interconnection arrangement between the reference voltage node and the GND pad has been illustrated here, the same applies to interconnection arrangement between a power supply voltage node and a power source pad.

As described above, according to the present embodiment, it is possible to suppress a fluctuation of the power supply voltage or the reference voltage in a comparator including a positive feedback circuit. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Eleventh Embodiment

A photoelectric conversion device according to an eleventh embodiment of the present invention will be described with reference to FIG. 23 to FIG. 25. The same components as those of the photoelectric conversion device according to the first to tenth embodiments are labeled with the same references, and the description thereof will be omitted or simplified.

Figure 23:
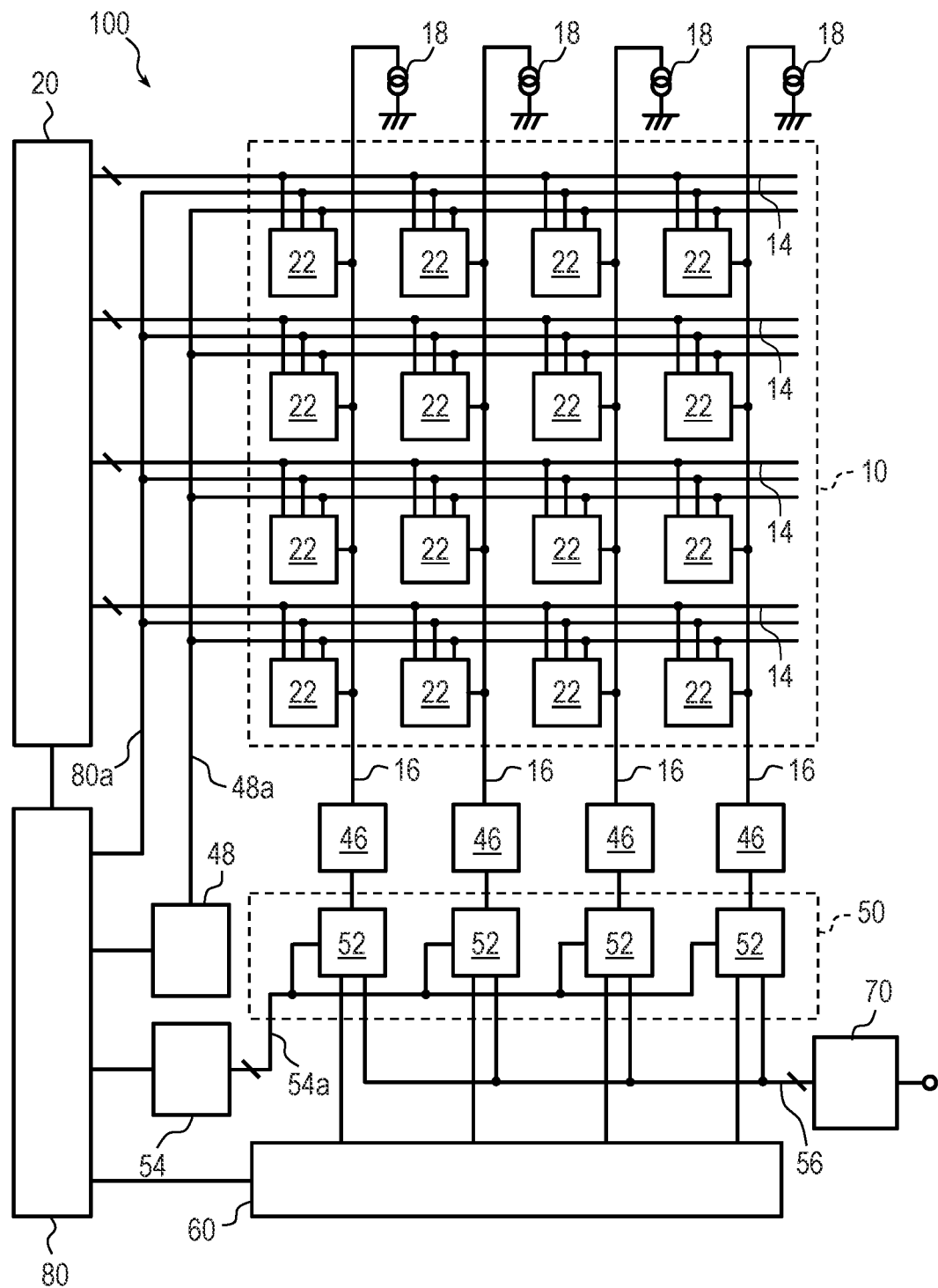
FIG. 23 is a block diagram illustrating a general configuration of a photoelectric conversion device according to an eleventh embodiment of the present invention.

FIG. 23 is a block diagram illustrating the general configuration of the photoelectric conversion device according to the present embodiment. In the photoelectric conversion device 100 according to the present embodiment, a circuit unit corresponding to the pixel 12 and the comparator 32 of the first embodiment is defined as one pixel unit 22, and such pixel units 22 are arranged in a matrix over a plurality of rows and a plurality of columns in the pixel array unit 10.

On each row of the pixel array unit 10, the control line 14 is arranged extending in the first direction (horizontal direction in FIG. 23). Each of the control lines 14 is connected to the pixel units 22 aligned in the first direction, respectively, to form a signal line common to these pixel units 22.

The output node of the pixel unit 22 corresponds to the node OUT of the positive feedback circuit 40 and is connected to the output line 16 on each column. The output line 16 on each column is connected to the pulse generator 46 on a corresponding column. The circuit configuration of the pulse generator 46 and on the downstream stage thereof is the same as that in the previous embodiments.

The control signal INI is supplied to the plurality of pixel units 22 arranged in the pixel array unit 10 from the control circuit 80 via the control line 80a. Further, the reference signal RAMP is supplied to the plurality of pixel units 22 arranged in the pixel array unit 10 from the reference signal generation circuit 48 via the reference signal line 48a.

Figure 24:
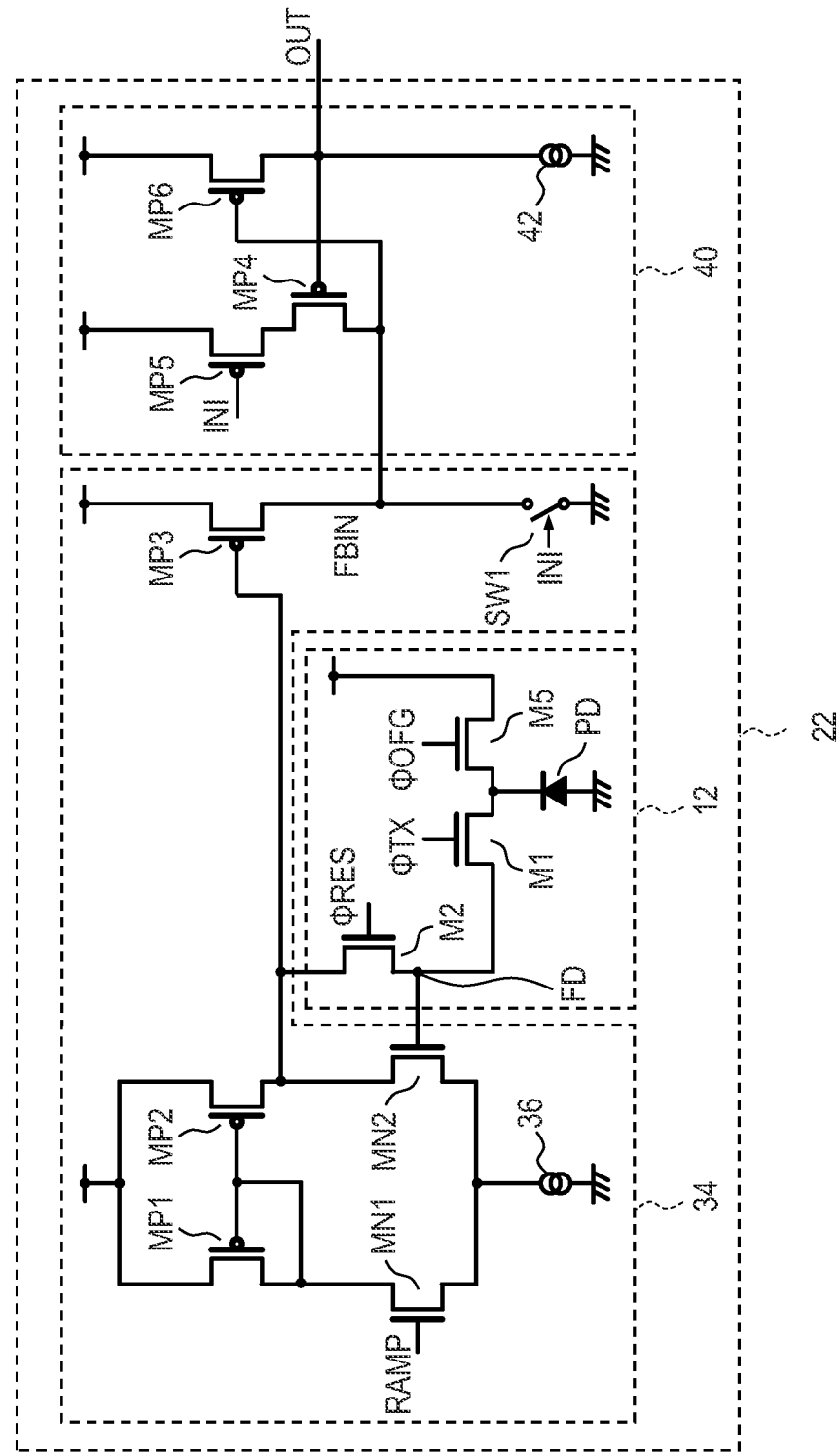
FIG. 24 is a circuit diagram illustrating a configuration example of a pixel unit in the photoelectric conversion device according to the eleventh embodiment of the present invention.

FIG. 24 is a circuit diagram illustrating a configuration example of a pixel unit in the photoelectric conversion device according to the present embodiment. As illustrated in FIG. 24, each of the pixel units 22 includes the pixel 12, the comparison circuit 34, and the positive feedback circuit 40.

The pixel 12 may be formed of a photoelectric converter PD, a transfer transistor M1, a reset transistor M2, and an overflow transistor M5, as illustrated in FIG. 24, for example.

The photoelectric converter PD is a photodiode, for example, the anode thereof is connected to a reference voltage node, and the cathode thereof is connected to the source of the transfer transistor M1 and the source of the overflow transistor M5. The drain of the transfer transistor M1 is connected to the source of the reset transistor M2. The connection node of the drain of the transfer transistor M1 and the source of the reset transistor M2 is a floating diffusion portion FD. The floating diffusion portion FD corresponds to the output node of the pixel 12 and is connected to the gate of the n-channel transistor MN2 that is a non-inverting input terminal of the comparison circuit 34. The drain of the reset transistor M2 is connected to the connection node of the drain of the p-channel transistor MP2, the drain of the n-channel transistor MN2, and the gate of the p-channel transistor MP3. The drain of the overflow transistor M5 is connected to the power supply voltage node.

In the case of the circuit configuration of FIG. 24, the control line 14 on each row arranged in the pixel array unit 10 includes signal lines TX, RES, and OFG. The signal line TX is connected to the gates of the transfer transistors M1 of the pixel units 22 belonging to a corresponding row, respectively, to form a signal line common to these pixel units 22. The signal line RES is connected to the gates of the reset transistors M2 of the pixel units 22 belonging to a corresponding row, respectively, to form a signal line common to these pixel units 22. The signal line OFG is connected to the gates of the overflow transistors M5 of the pixel units 22 belonging to a corresponding row, respectively, to form a signal line common to these pixel units 22.

A control signal ΦTX that is a drive pulse used for controlling the transfer transistor M1 is supplied to the signal line TX from the vertical scanning circuit 20. A control signal ΦRES that is a drive pulse used for controlling the reset transistor M2 is supplied to the signal line RES from the vertical scanning circuit 20. A control signal ΦOFG that is a drive pulse used for controlling the overflow transistor M5 is supplied to the signal line OFG from the vertical scanning circuit 20. When each transistor is formed of an n-channel transistor, a corresponding transistor is turned on in response to a control signal at the H level being supplied from the vertical scanning circuit 20. Further, a corresponding transistor is turned off in response to a control signal at the L level being supplied from the vertical scanning circuit 20.

Note that, although FIG. 24 illustrates the example in which the comparison circuit 34 and the positive feedback circuit 40 of the first embodiment are applied as the comparison circuit 34 and the positive feedback circuit 40 of the pixel unit 22, the comparison circuit 34 and the positive feedback circuit 40 of another embodiment may be applied. Further, the circuit configuration of the pixel 12 is not limited to that illustrated in FIG. 24.

Figure 25:
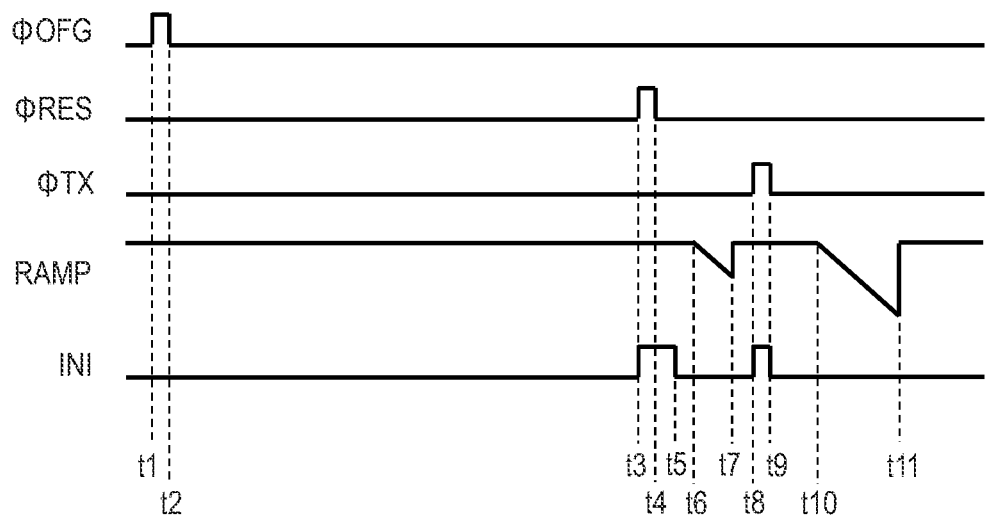
FIG. 25 is a timing diagram illustrating the operation of the photoelectric conversion device according to the eleventh embodiment of the present invention.

FIG. 25 is a timing diagram illustrating the operation of the photoelectric conversion device according to the present embodiment. FIG. 25 illustrates the control signals ΦOFG, ΦRES, ΦTX, and INI and the reference signal RAMP.

In the period before time t1, the control signals ΦOFG, ΦRES, ΦTX, and INI are at the L level. Further, the reference signal RAMP is at a predetermined reference level.

In the period from time t1 to time t2, the vertical scanning circuit 20 controls the control signal ΦOFG of a row to be read out from the L level to the H level. Thereby, the overflow transistors M5 of the pixel units 22 belonging to a corresponding row are turned on, and charge of the photoelectric converters PD are reset. The timing when the control signal ΦOFG transitions from the H level to the L level is a start timing of an exposure period in the photoelectric converter PD.

In the subsequent period from time t3 to time t4, the vertical scanning circuit 20 controls the control signal ΦRES of a row to be read out from the L level to the H level. Thereby, the reset transistors M2 of the pixel units 22 belonging to a corresponding row are turned on, and charge of the floating diffusion portion FD are reset. The timing when the control signal ΦOFG transitions from the H level to the L level is a start timing of an exposure period in the photoelectric converter PD.

Further, in the period from time t3 to time t5, the control circuit 80 controls the control signal INI from the L level to the H level. Thereby, the p-channel transistor MP5 is turned off, the switch SW1 is turned on, and the node FBIN is reset to the L level.

In the subsequent period from time t6 to time t7, the reference signal generation circuit 48 changes the potential level of the reference signal RAMP gradually and performs AD conversion on a signal in accordance with the reset level of the pixel 12.

In the subsequent period from time t8 to time t9, the vertical scanning circuit 20 controls the control signal ΦTX of a row to be read out from the L level to the H level. The timing when the control signal ΦTX transitions from the H level to the L level is an end timing of the exposure period in the photoelectric converter PD. Thereby, charge generated and accumulated in the photoelectric converter PD during the exposure period are transferred to the floating diffusion portion FD. The potential of the floating diffusion portion FD, which is also the inverting input terminal of the comparison circuit 34, is reduced to a potential in accordance with the amount of charge transferred from the photoelectric converter PD.

Further, in the same period from time t8 to time t9, the control circuit 80 controls the control signal INI from the L level to the H level. Thereby, the p-channel transistor MP5 is turned off, the switch SW1 is turned on, and the node FBIN is reset to the L level.

In the subsequent period from time t10 to time t11, the reference signal generation circuit 48 changes the potential level of the reference signal RAMP gradually and performs AD conversion on a signal in accordance with the amount of signal charge.

Note that, although FIG. 25 illustrates only the control signals ΦOFG, ΦRES, and ΦTX of a single row, these control signals of a plurality of rows forming the pixel array unit 10 may be driven on a row basis or may be driven simultaneously for a plurality of rows. When a plurality of rows are driven simultaneously, multiple sets of readout circuits corresponding to the number of rows to be read out simultaneously are arranged as described in the ninth embodiment, for example. Alternatively, with respect to the control signal ΦTX, driving may be performed on a row basis, and readout may be performed in a time division manner on a row basis.

As described above, according to the present embodiment, it is possible to suppress a fluctuation of the power supply voltage or the reference voltage in a comparator including a positive feedback circuit. It is therefore possible to reduce an AD conversion error by using such a comparator to form an AD conversion circuit. Further, it is possible to acquire a high quality image with a smaller AD conversion error by using such an AD conversion circuit to form a photoelectric conversion device.

Note that, although the pixel unit 22 is formed of the pixel 12, the comparison circuit 34, and the positive feedback circuit 40 in the present embodiment, the pixel unit 22 may further include the pulse generator 46 or further include the pulse generator 46 and the memory 52.

Twelfth Embodiment

Figure 26A:
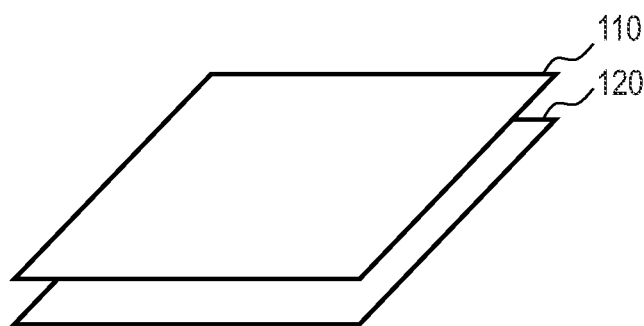
FIG. 26A and FIG. 26B are schematic diagrams illustrating a configuration example of a photoelectric conversion device according to a twelfth embodiment of the present invention.
Figure 26B:
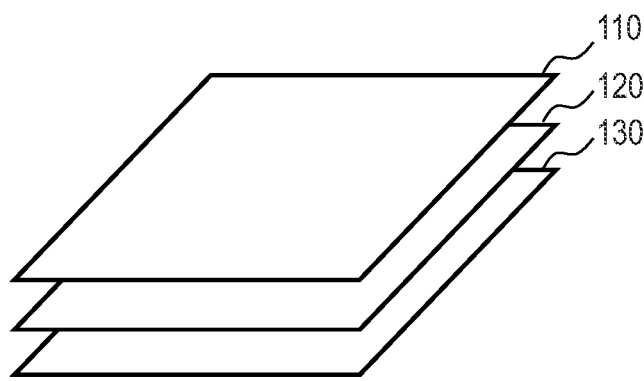

A photoelectric conversion device according to a twelfth embodiment of the present invention will be described with reference to FIG. 26A and FIG. 26B. The same components as those of the photoelectric conversion device according to the first to eleventh embodiments are labeled with the same references, and the description thereof will be omitted or simplified. FIG. 26A and FIG. 26B are schematic diagrams illustrating configuration examples of the photoelectric conversion device according to the present embodiment.

The photoelectric conversion device described in the first to eleventh embodiments may be configured such that all the circuit blocks are arranged on a single substrate or such that a plurality of substrates are stacked to form a stacked type device and the circuit blocks are divided into respective substrates.

FIG. 26A is a schematic diagram of a case where a pixel substrate 110 on which the pixel array unit 10 is arranged and a circuit substrate 120 on which the remaining circuit blocks are arranged are stacked. With the pixel substrate 110 and the circuit substrate 120 being arranged as different substrates, it is possible to reduce the size of the photoelectric conversion device without sacrificing the area of the pixel array unit 10.

FIG. 26B is a schematic diagram of a case where a pixel substrate 110 on which the pixel array unit 10 is arranged and circuit substrates 120 and 130 on which the remaining circuit blocks are arranged are stacked. Also in such a case, it is possible to reduce the size of the photoelectric conversion device without sacrificing the area of the pixel array unit 10.

Note that circuit elements forming one function block are not necessarily required to be arranged on the same substrate and may be arranged on respective substrates. For example, out of the circuit elements forming the comparison circuit 34, the p-channel transistors MP1 and MP2 forming a current mirror may be arranged on one circuit substrate, and the n-channel transistors MN1 and MN2 forming a differential pair may be arranged on another circuit substrate. Alternatively, the p-channel transistors MP1 and MP2 forming a current mirror may be arranged on a circuit substrate, and the re-channel transistors MN1 and MN2 forming a differential pair may be arranged on a pixel substrate.

Thirteenth Embodiment

Figure 27:
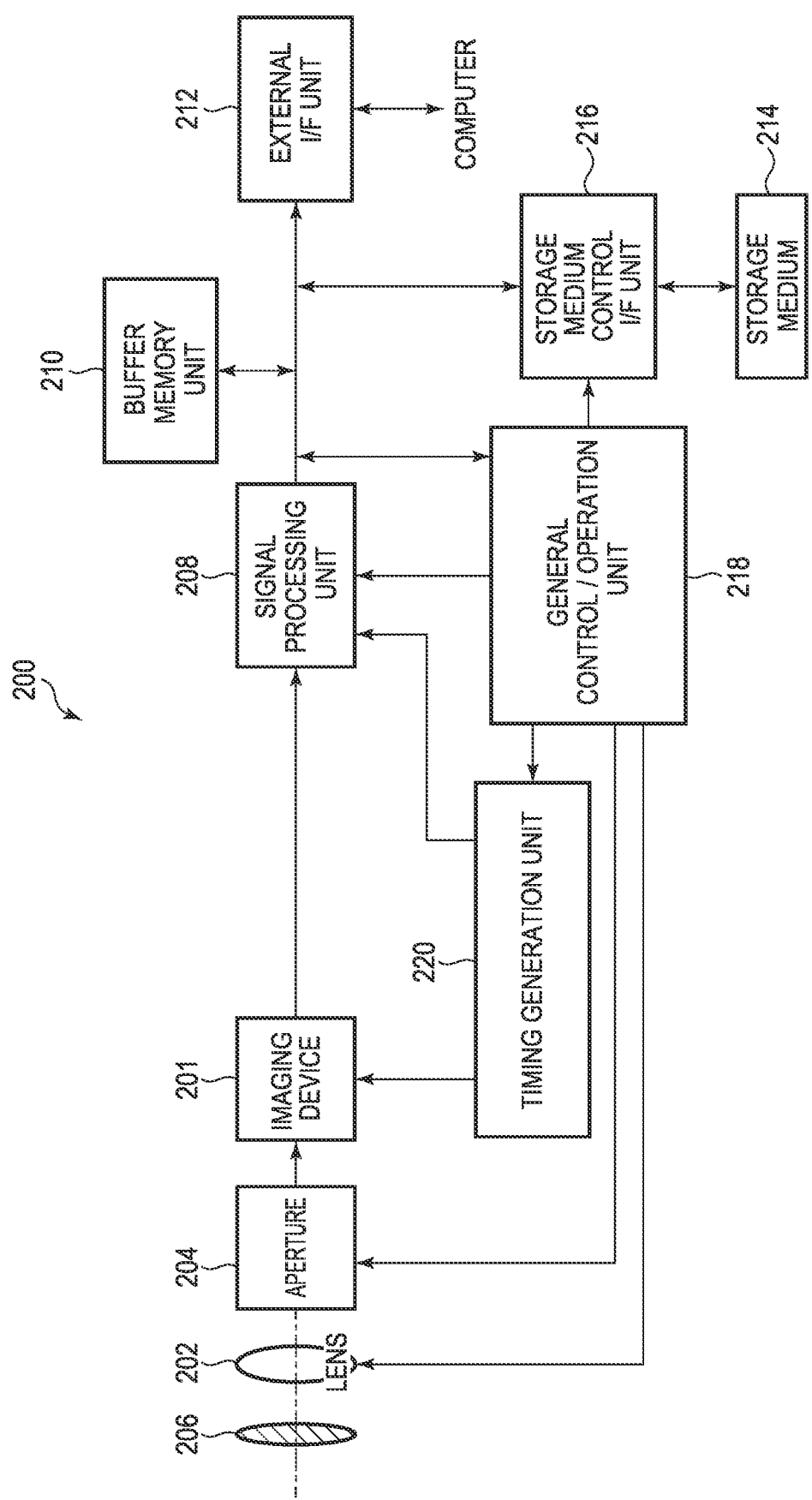
FIG. 27 is a block diagram illustrating a general configuration of an imaging system according to a thirteenth embodiment of the present invention.

An imaging system according to a thirteenth embodiment of the present invention will be described with reference to FIG. 27. FIG. 27 is a block diagram illustrating a general configuration of the imaging system according to the present embodiment.

The photoelectric conversion device 100 described in the above first to twelfth embodiments can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 27 illustrates a block diagram of a digital still camera as an example out of these examples.

An imaging system 200 illustrated as an example in FIG. 27 includes an imaging device 201, a lens 202 that captures an optical image of a subject onto the imaging device 201, an aperture 204 for changing a light amount passing through the lens 202, and a barrier 206 for protecting the lens 202. The lens 202 and the aperture 204 form an optical system that collects a light onto the imaging device 201. The imaging device 201 is the photoelectric conversion device 100 described in any of the first to twelfth embodiments and converts an optical image captured by the lens 202 into image data.

Further, the imaging system 200 includes a signal processing unit 208 that processes an output signal output from the imaging device 201. The signal processing unit 208 generates image data from digital signals output by the imaging device 201. Further, the signal processing unit 208 performs operations of performing various correction or compression to output image data, if necessary.

Furthermore, the imaging system 200 includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

Furthermore, the imaging system 200 includes a general control/operation unit 218 that performs various calculation and controls the entire digital still camera and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

As described above, according to the present embodiment, the imaging system to which the photoelectric conversion device 100 according to any of the first to twelfth embodiments is applied can be realized.

Fourteenth Embodiment

Figure 28A:
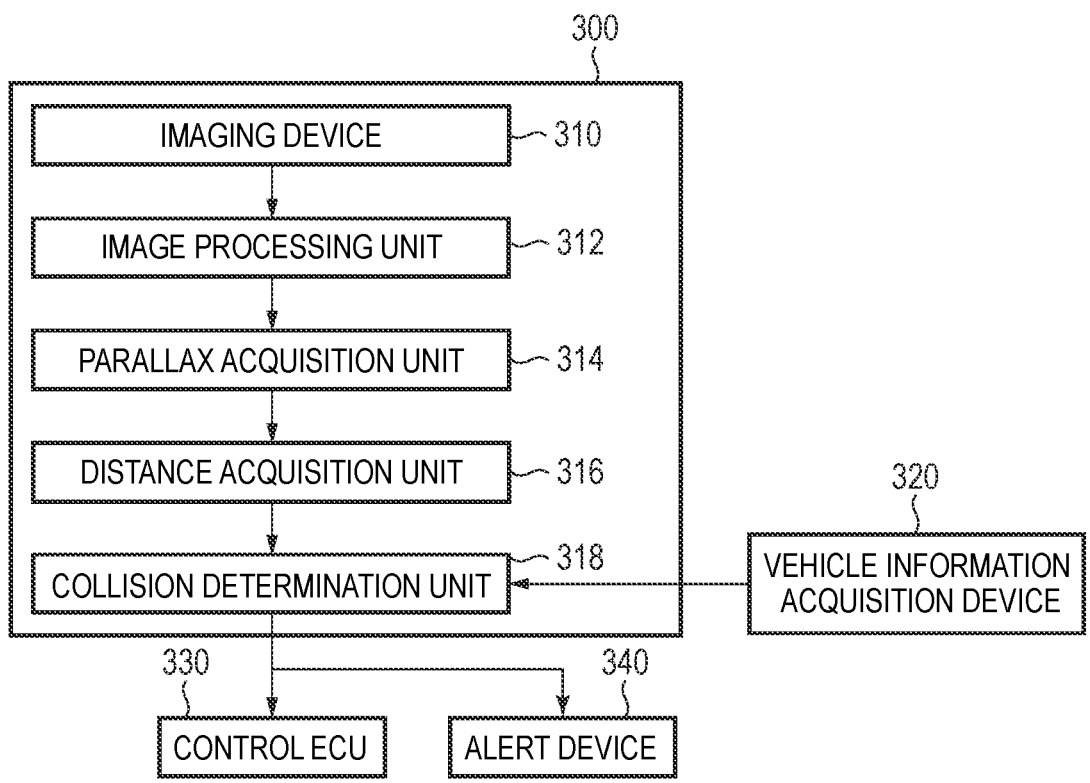
FIG. 28A is a diagram illustrating a configuration example of an imaging system according to a fourteenth embodiment of the present invention.
Figure 28B:
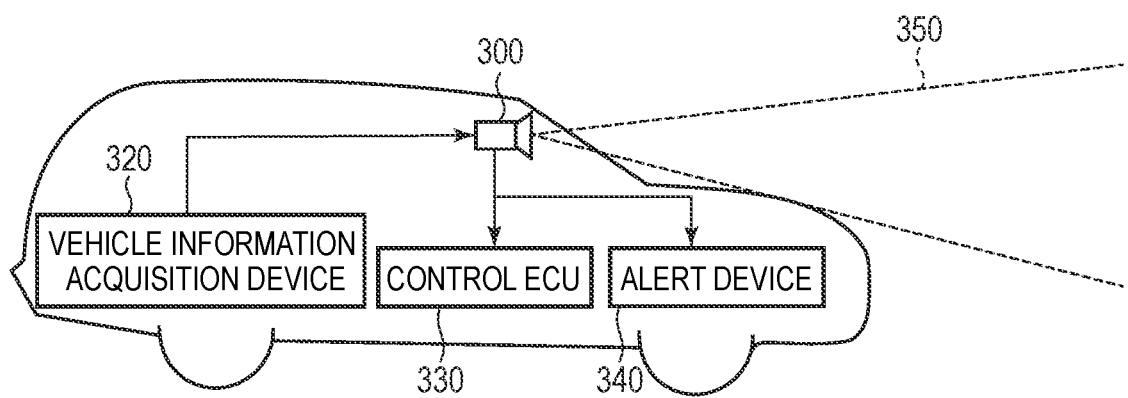
FIG. 28B is a diagram illustrating a configuration example of a movable object according to the fourteenth embodiment of the present invention.

An imaging system and a movable object according to a fourteenth embodiment of the present invention will be described with reference to FIG. 28A and FIG. 28B. FIG. 28A is a diagram illustrating a configuration of the imaging system according to the present embodiment. FIG. 28B is a diagram illustrating a configuration of the movable object according to the present embodiment.

FIG. 28A illustrates an example of an imaging system related to an on-vehicle camera. An imaging system 300 includes an imaging device 310. The imaging device 310 is the photoelectric conversion device 100 described in any of the above first to twelfth embodiments. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by a combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 28B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is also one of the embodiments of the present invention.

Further, the pixel circuit illustrated in FIG. 2 is an example, and the circuit configuration of the pixel 12 is not limited thereto. For example, a single pixel 12 may include a plurality of photoelectric converters PD or may further include a holding portion that can hold charge in addition to the photoelectric converter PD and the floating diffusion portion FD.

Further, although the examples in which the present invention is applied to the photoelectric conversion device in the first to twelfth embodiments have been illustrated, a comparator, an AD converter, or the like to which the present invention is applied can be realized.

Further, the photoelectric conversion device described in each of the above first to twelfth embodiments can be configured as a device intended for acquisition of an image, that is, an imaging device. Alternatively, in a case of application to a device mainly intended for ranging as described in the above fourteenth embodiment, it is not necessarily required to output an image. In such a case, it can be said that such a device is a photoelectric conversion device that converts optical information into a predetermined electrical signal. The imaging device is one of the photoelectric conversion devices.

Further, the imaging systems illustrated in the above thirteenth and fourteenth embodiments are examples of an imaging system to which the photoelectric conversion device of the present invention may be applied, and an imaging system to which the photoelectric conversion device of the present invention can be applied is not limited to the configuration illustrated in FIG. 27 and FIG. 28A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-030600, filed Feb. 26, 2020, which is hereby incorporated by reference herein in its entirety.

What is claimed is:

1. A comparator comprising:
a comparison circuit that performs comparison between an input signal and a reference signal and changes a level of a signal to be output to a first node in accordance with a result of the comparison; and
a positive feedback circuit including an amplifier unit that includes a current source load and outputs a signal in accordance with a potential of the first node to a second node, and a feedback unit that positively feeds back a signal in accordance with a potential of the second node to the first node,
wherein the feedback unit includes a first transistor to which output of the amplifier unit is fed back and a switch that controls turning on or off of the first transistor, and
wherein the amplifier unit of the positive feedback circuit includes a second transistor of a first conductivity type whose first main node is connected to a first voltage node supplied with a first voltage and whose control node is connected to the first node and a first current source load connected between a second voltage node supplied with a second voltage, which is different from the first voltage, and a second main node of the second transistor.

2. The comparator according to claim 1,
wherein the comparison circuit includes a differential unit to which the input signal and the reference signal are input, and an amplifier unit connected to an output node of the differential unit, and
wherein the amplifier unit of the comparison circuit includes a third transistor of the first conductivity type whose first main node is connected to a third voltage node supplied with the first voltage, whose second main node is connected to the first node, and whose control node is connected to the output node of the differential unit.

3. The comparator according to claim 1, wherein the amplifier unit of the positive feedback circuit further includes a fourth transistor of the first conductivity type whose first main node is connected to the first voltage node and whose control node is connected to the first node and a third current source load connected between a second main node of the fourth transistor and the second voltage node.

4. The comparator according to claim 1, wherein the amplifier unit of the positive feedback circuit further includes a seventh transistor of a second conductivity type whose first main node is connected to the first voltage node and whose control node is connected to the first node and a fourth current source load connected between a second main node of the seventh transistor and the second voltage node.

5. The comparator according to claim 1 further comprising a reset switch connected between a fourth node supplied with the second voltage and the first node.

6. The comparator according to claim 1,
wherein the switch is an eighth transistor of the first conductivity type whose first main node is connected to a fifth voltage node supplied with the first voltage, and
wherein the first transistor is of the first conductivity type and has a first main node connected to a second main node of the eighth transistor, a second main node connected to the first node, and a control node connected to the second main node of the second transistor.

7. The comparator according to claim 1,
wherein the switch is a ninth transistor of a second conductivity type whose first main node is connected to the first node, and
wherein the first transistor is of the second conductivity type and has a first main node connected to a second main node of the ninth transistor, a second main node connected to a sixth voltage node supplied with the second voltage, and a control node connected to the second main node of the second transistor.

8. The comparator according to claim 1, wherein the first voltage is a power supply voltage, and the second voltage is a reference voltage.

9. The comparator according to claim 1, wherein the current source load forms a gate grounded circuit and includes a tenth transistor whose control node is supplied with a bias voltage that is different from a reference voltage and a bias hold capacitor connected to a control node of the tenth transistor.

10. The comparator according to claim 1, wherein the second node is an output node of the positive feedback circuit.

11. The comparator according to claim 1, wherein the first node is an output node of the positive feedback circuit.

12. The comparator according to claim 1, wherein the comparison circuit includes a clamp capacitor provided to a node to which the input signal is input and a clamp capacitor provided to a node to which the reference signal is input.

13. A photoelectric conversion device comprising:
a plurality of pixel units arranged so as to form a plurality of rows and a plurality of columns and each including a pixel including a photoelectric converter and the comparator according to claim 1 in which a signal in accordance with charge generated in the photoelectric converter of the pixel is the input signal;
a plurality of output lines arranged on each of the plurality of columns and each connected to the pixel units on a corresponding column; and
a counter circuit that is provided in association with each of the plurality of output lines and outputs, as digital data of the input signal, a count value in accordance with a length of a period from start of comparison between the input signal and the reference signal to a change of a level of a signal output from the pixel unit on a corresponding column.

14. The comparator according to claim 2, wherein the amplifier unit of the comparison circuit further includes a second current source load connected between a fourth voltage node supplied with the second voltage and the second main node of the third transistor.

15. The comparator according to claim 14, wherein the first current source load and the second current source load are configured to cancel respective current fluctuations.

16. The comparator according to claim 14,
wherein the comparison circuit is configured to output a high-level signal or a low-level signal, and
wherein a current amount of the second current source load is less than a current amount of the first current source load when an output of the comparison circuit is one of the high-level signal and the low-level signal, and the current amount of the second current source load is greater than the current amount of the first current source load when the output of the comparison circuit is the other of the high-level signal and the low-level signal.

17. The comparator according to claim 3, wherein the amplifier unit of the positive feedback circuit further includes a fifth transistor of the first conductivity type connected between the first main node of the second transistor and the first voltage node and a sixth transistor of the first conductivity type connected between the first main node of the fourth transistor and the first voltage node.

18. The comparator according to claim 6 further comprising:
a pad electrode used for supplying the first voltage;
a first interconnection connected between the pad electrode and at least one of the first voltage node and the fifth voltage node; and
a second interconnection connected between the pad electrode and the comparison circuit.

19. The comparator according to claim 6 further comprising:
a first pad electrode and a second pad electrode used for supplying the first voltage;
a first interconnection connected between the first pad electrode and at least one of the first voltage node and the fifth voltage node; and
a second interconnection connected between the second pad electrode and the comparison circuit.

20. The comparator according to claim 7 further comprising:
a pad electrode used for supplying the second voltage;
a third interconnection connected between the pad electrode and at least one of the second voltage node and the sixth voltage node; and
a fourth interconnection connected between the pad electrode and the comparison circuit.

21. The comparator according to claim 7 further comprising:
a third pad electrode and a fourth pad electrode used for supplying the second voltage;
a third interconnection connected between the third pad electrode and at least one of the second voltage node and the sixth voltage node; and
a fourth interconnection connected between the fourth pad electrode and the comparison circuit.

22. An imaging system comprising:
the photoelectric conversion device according to claim 13; and
a signal processing unit that processes a signal output from the photoelectric conversion device.

23. A movable object comprising:
the photoelectric conversion device according to claim 13;
a distance information acquisition unit that acquires distance information on a distance to an object, from a parallax image based on signals from the photoelectric conversion device; and
a control unit that controls the movable object based on the distance information.

24. An analog-to-digital converter comprising:
a comparator including:
a comparison circuit that performs comparison between an input signal and a reference signal and changes a level of a signal to be output to a first node in accordance with a result of the comparison; and
a positive feedback circuit including an amplifier unit that includes a current source load and outputs a signal in accordance with a potential of the first node to a second node, and a feedback unit that positively feeds back a signal in accordance with a potential of the second node to the first node,
wherein the feedback unit includes a first transistor to which output of the amplifier unit is fed back and a switch that controls turning on or off of the first transistor; and
a counter circuit that outputs, as digital data of the input signal, a count value in accordance with a length of a period from start of comparison between the input signal and the reference signal to a change of a level of the signal output to the first node.

25. A photoelectric conversion device comprising:
a plurality of pixels arranged so as to form a plurality of rows and a plurality of columns and each including a photoelectric converter;

a plurality of output lines each arranged on each of the plurality of columns and each connected to the pixels on a corresponding column; and a plurality of analog-to-digital converters according to claim 24 each connected to each of the plurality of output lines and configured to perform analog-to-digital conversion on pixel signals output from the pixels on a corresponding column.

26. The photoelectric conversion device according to claim 25, wherein two or more of the output lines are arranged on each of the plurality of columns.

27. The photoelectric conversion device according to claim 26, wherein comparison circuits and positive feedback circuits of two or more of the analog-to-digital converters arranged on the same column are arranged close to each other for each of the comparison circuits and the positive feedback circuits.

28. The photoelectric conversion device according to claim 25 comprising:

a first substrate on which the photoelectric converter is provided; and a second substrate that is stacked on the first substrate and on which at least a part of the comparator is provided.

29. An imaging system comprising:

the photoelectric conversion device according to claim 25; and a signal processing unit that processes a signal output from the photoelectric conversion device.

30. A movable object comprising:

the photoelectric conversion device according to claim 25;

a distance information acquisition unit that acquires distance information on a distance to an object, from a parallax image based on signals from the photoelectric conversion device; and a control unit that controls the movable object based on the distance information.

* * * * *